(12) United States Patent
Takagi

(10) Patent No.: US 8,106,503 B2
(45) Date of Patent: Jan. 31, 2012

(54) HIGH FREQUENCY SEMICONDUCTOR DEVICE

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/913,170

(22) Filed: Oct. 27, 2010

(65) Prior Publication Data
US 2011/0181350 A1   Jul. 28, 2011

(30) Foreign Application Priority Data

Jan. 22, 2010  (JP) ................................. 2010-012261
Sep. 21, 2010  (JP) ................................. 2010-211207

(51) Int. Cl.
 H01L 23/50 (2006.01)
(52) U.S. Cl. ................................ 257/691; 257/E23.079
(58) Field of Classification Search .......... 257/690–693, 257/724, 728, E23.141
See application file for complete search history.

(56) References Cited

U.S. PATENT DOCUMENTS

| | | | | |
|---|---|---|---|---|
| 6,414,389 | B1 * | 7/2002 | Hume et al. .................. | 257/732 |
| 7,015,570 | B2 * | 3/2006 | Emma et al. .................. | 257/685 |
| 7,061,329 | B2 * | 6/2006 | Inoue et al. .................. | 330/302 |
| 7,760,498 | B2 * | 7/2010 | Shan et al. .................... | 361/695 |
| 2003/0038362 | A1 * | 2/2003 | Nomura ......................... | 257/706 |
| 2004/0178854 | A1 * | 9/2004 | Inoue et al. .................. | 330/302 |
| 2007/0001283 | A1 * | 1/2007 | Laska et al. .................. | 257/692 |
| 2007/0170577 | A1 * | 7/2007 | Dangelmaier et al. ........ | 257/693 |
| 2007/0229187 | A1 | 10/2007 | Takagi | |
| 2007/0252265 | A1 * | 11/2007 | Sander .......................... | 257/691 |
| 2008/0224300 | A1 * | 9/2008 | Otremba ....................... | 257/693 |
| 2009/0108357 | A1 | 4/2009 | Takagi | |
| 2009/0109646 | A1 * | 4/2009 | Kizilyalli et al. ............. | 361/820 |
| 2009/0251119 | A1 * | 10/2009 | Stojcic et al. ................. | 323/282 |
| 2010/0140721 | A1 | 6/2010 | Takagi | |
| 2010/0200979 | A1 * | 8/2010 | Blair et al. .................... | 257/691 |

FOREIGN PATENT DOCUMENTS

| | | |
|---|---|---|
| JP | 3954114 | 8/2007 |
| WO | WO 98/47222 | 10/1998 |

OTHER PUBLICATIONS

U.S. Appl. No. 12/786,942, filed May 25, 2010, Kazutaka Takagi.

* cited by examiner

*Primary Examiner* — Nathan Ha
(74) *Attorney, Agent, or Firm* — Oblon, Spivak, McClelland, Maier & Neustadt, L.L.P.

(57) ABSTRACT

According to one embodiment, a high frequency semiconductor device is provided, which includes: a distribution/input matching circuit board that mounts thereon a distribution/input matching circuit and an input transmission line pattern; an input capacitor board that is arranged adjacent to the distribution/input matching circuit board, and mounts a plurality of input capacitor cells thereon; a semiconductor board that is arranged adjacent to the input capacitor board, and mounts a plurality of field effect transistor cells thereon; an output capacitor board that is arranged adjacent to the semiconductor board, and mounts a plurality of output capacitor cells thereon; and a synthesis/output matching circuit board that is arranged adjacent to the output capacitor board, and mounts thereon an output transmission line pattern and a synthesis/output matching circuit, wherein the number of active field effect transistor cells is changed by connecting and disconnecting a plurality of field effect transistor cells to one another in response to a desired output power value, whereby a total gate electrode length is substantially changed, and an output power value is adjusted.

15 Claims, 17 Drawing Sheets

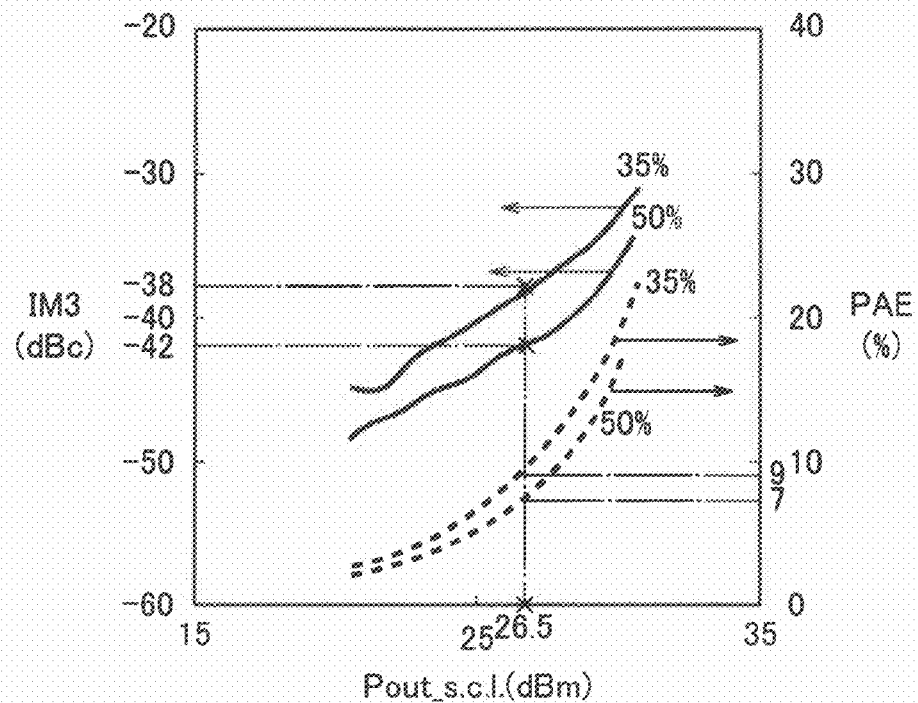
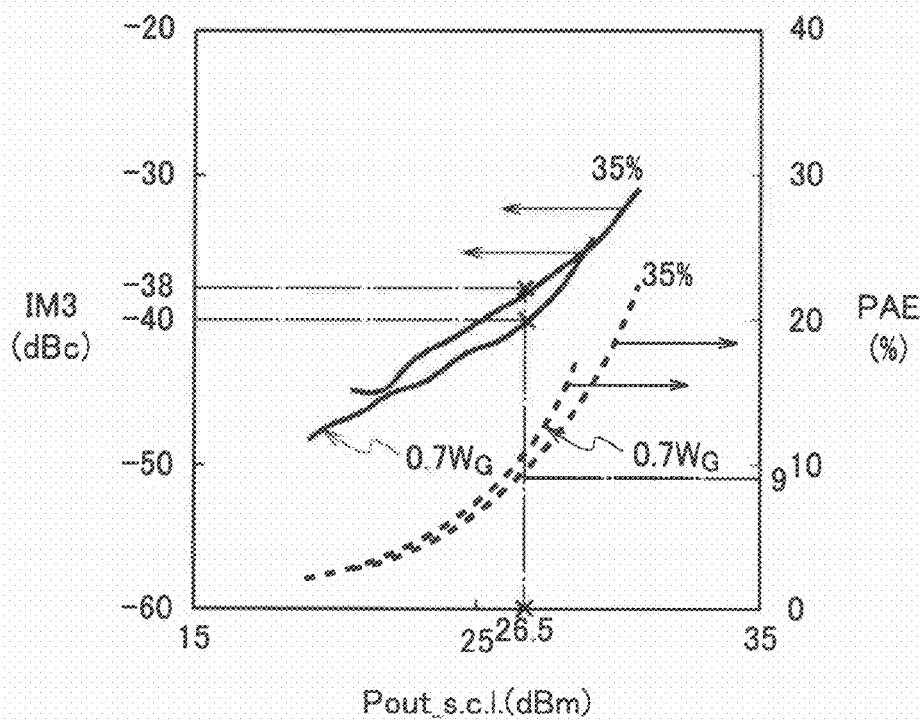

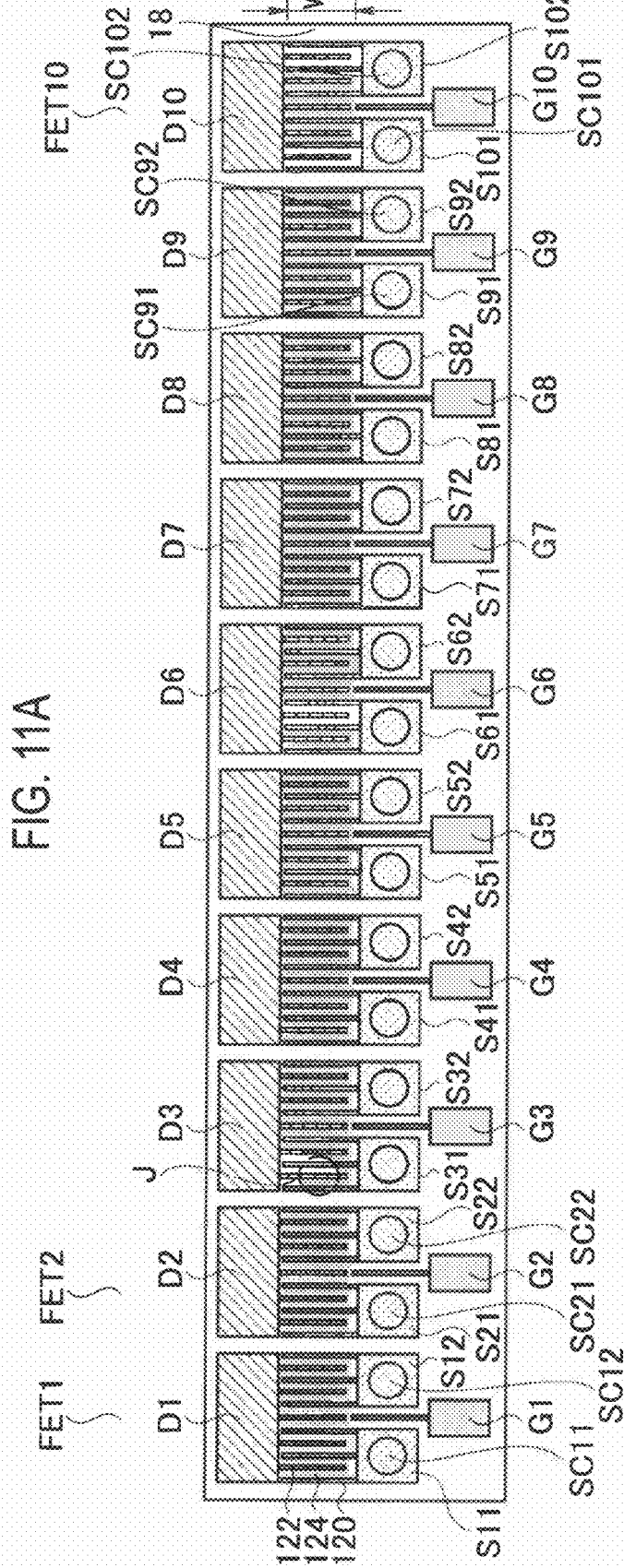
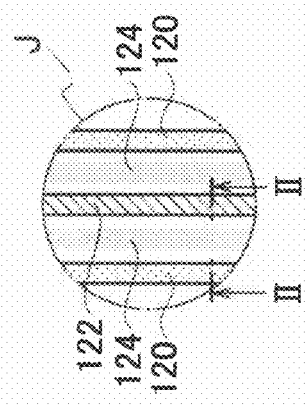
FIG. 11A
FIG. 11B

HIGH FREQUENCY SEMICONDUCTOR DEVICE

CROSS REFERENCE TO RELATED APPLICATIONS

This application is based upon and claims the benefit of priority from prior Japanese Patent Applications No. P2010-012261 filed on Jan. 22, 2010 and No. P2010-211207 filed on Sep. 21, 2010, the entire contents of which are incorporated herein by reference.

FIELD

Embodiments described herein relate generally to a high frequency semiconductor device.

BACKGROUND

In a conventional high frequency semiconductor device, in order to obtain desired output power, it is necessary to design an exclusive field effect transistor (FET), in which a total gate electrode length is changed, in response to a value of the output power every time when the value concerned is changed.

Moreover, as another method for obtaining the desired output power, a method is adopted, in which FETs with a multi-cell configuration are formed, power supplies are individually prepared for cells of the FETs, when a value of the desired output power is small, some of such FET cells are made not to operate by changing a voltage to be supplied thereto, and when the value of the desired output power is large, a predetermined supply voltage is supplied to all of the FET cells, whereby the value of the desired output power is obtained.

However, in accordance with the conventional method of designing the FET every time when the value of the output power is changed, a mass production effect is not obtained, whereby it is difficult to suppress cost. Moreover, in accordance with the conventional method of changing the supply voltage for each of the FET cells, a plurality of the power supplies must be prepared and individually controlled, and accordingly, a system therefor becomes complicated, and it is difficult to suppress the cost.

BRIEF DESCRIPTION OF THE DRAWINGS

FIG. 9 is characteristic examples of the third-order intermodulation distortion IM3 (dBc) and the efficiency PAE (%) with respect to the output power Pout_s.c.l (dBm) in a case where the drain current Ids is set at 35% of the saturation drain current Idss in the high frequency semiconductor device according to the first embodiment.

FIG. 10 is characteristic examples of the third-order intermodulation distortion IM3 (dBc) and the efficiency PAE (%) with respect to the output power Pout_s.c.l (dBm) in a case where the drain current Ids is set at 50% of the saturation drain current Idss and a total gate electrode length WG is reduced by 30% in the high frequency semiconductor device according to the first embodiment.

FIG. 11A is an enlarged view of a schematic plane pattern configuration of a semiconductor board in the high frequency semiconductor device according to the first embodiment.

FIG. 11B is an enlarged view of a portion J of FIG. 11A.

DETAILED DESCRIPTION

Next, a description is made below of embodiments with reference to the drawings.

According to one embodiment, a high frequency semiconductor device includes: a distribution/input matching circuit board; an input capacitor board; a semiconductor board; an output capacitor board; and a synthesis/output matching circuit board.

The distribution/input matching circuit board mounts thereon a distribution/input matching circuit and an input transmission line pattern. The input capacitor board is arranged adjacent to the distribution/input matching circuit board, and mounts a plurality of input capacitor cells thereon. The semiconductor board is arranged adjacent to the input capacitor board, and mounts a plurality of field effect transistor cells thereon. The output capacitor board is arranged adjacent to the semiconductor board, and mounts a plurality of output capacitor cells thereon. The synthesis/output matching circuit board is arranged adjacent to the output capacitor board, and mounts thereon an output transmission line pattern and a synthesis/output matching circuit.

According to the one embodiment, a high frequency semiconductor device is provided, in which the number of active field effect transistor cells is changed by connecting and disconnecting a plurality of field effect transistor cells to one another in response to a desired output power value, whereby a total gate electrode length is substantially changed, and an output power value is adjusted.

First Embodiment (High Frequency Semiconductor Device)

Figure 1:
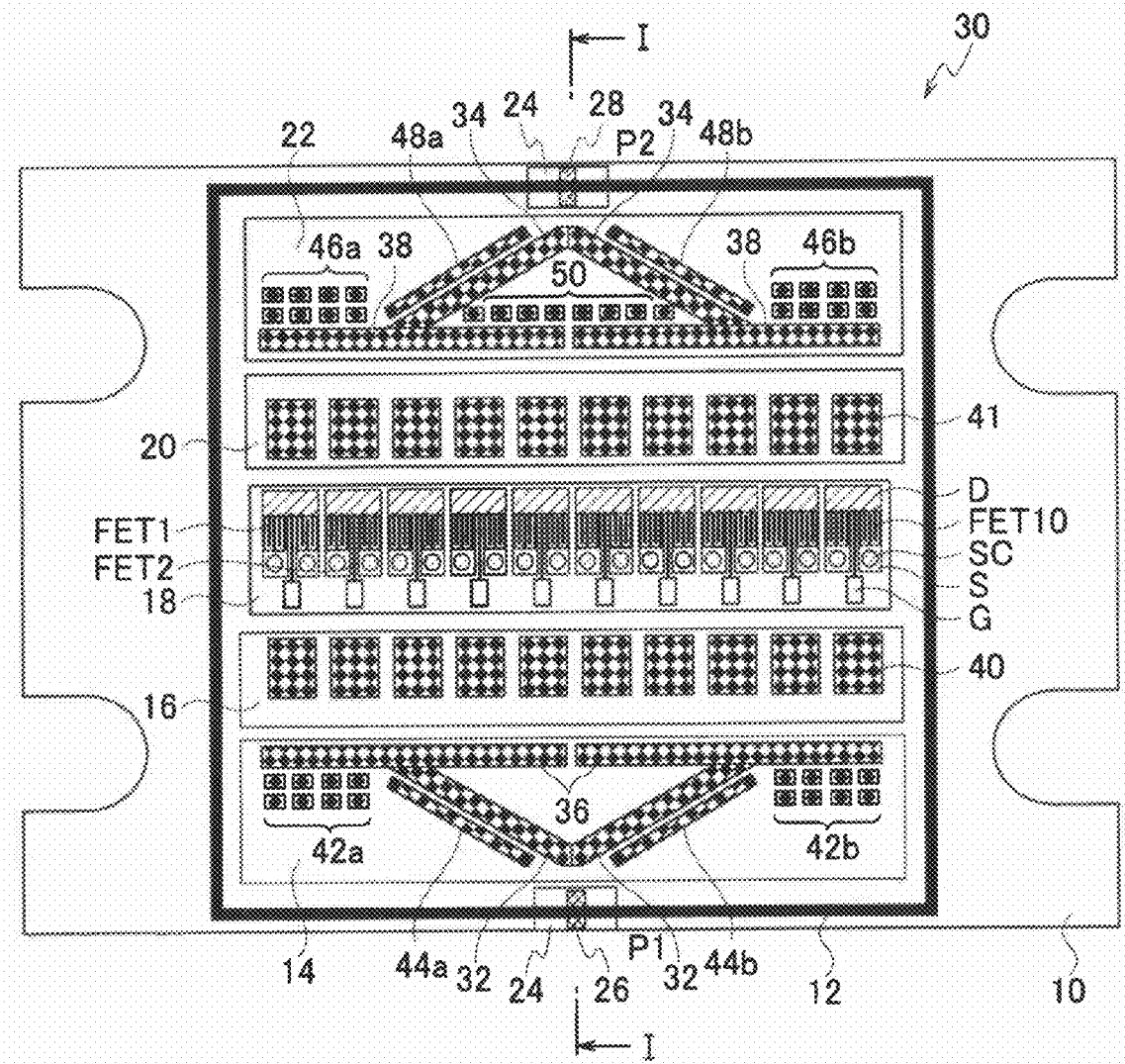
FIG. 1 is a schematic plane pattern configuration diagram of a high frequency semiconductor device according to a first embodiment.

A schematic plane pattern configuration of a high frequency semiconductor device according to a first embodiment is illustrated as shown in FIG. 1, and a schematic cross-sectional structure along a line I-I of FIG. 1 is illustrated as shown in FIG. 1.

Figure 2:
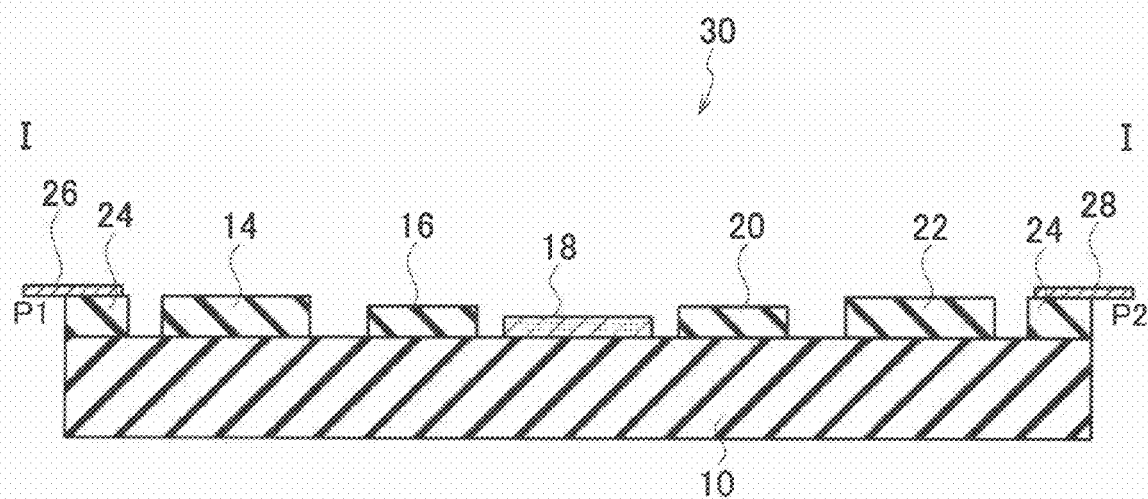
FIG. 2 is a schematic cross-sectional structure diagram along a line I-I of FIG. 1.

A high frequency semiconductor device 30 according to the first embodiment is arranged in a frame member 12 arranged on a package board 10. As shown in FIG. 1 and FIG. 2, the high frequency semiconductor device 30 includes: a distribution/input matching circuit board 14 that mounts thereon a distribution/input matching circuits 32 and an input transmission line pattern 26; an input capacitor board 16 that is arranged adjacent to the distribution/input matching circuit board 14, and mounts a plurality of input capacitor cells 40 thereon; a semiconductor board 18 that is arranged adjacent to the input capacitor board 16, and mounts a plurality of FET cells FET1 to FET10 thereon; an output capacitor board 20 that is arranged adjacent to the semiconductor board 18, and mounts a plurality of output capacitor cells 41 thereon; and a synthesis/output matching circuit board 22 that is arranged adjacent to the output capacitor board 20, and mounts thereon an output transmission line patterns 38 and a synthesis/output matching circuits 34.

In the high frequency semiconductor device 30 according to the first embodiment, the number of active FET cells is changed by connecting and disconnecting the plurality of FET cells FET1 to FET10 to one another in response to a desired output power value, whereby a total gate electrode length WG can be substantially changed. In such a way, the output power value can be adjusted.

Here, when Wg is a gate electrode length of an FET cell unit, Ng is the number of gate lines in one cell of the FET cell unit, and Nc is the number of cells of the FET cell unit, the total gate electrode length WG is equal to Wg×Ng×Nc.

As shown in FIG. 2, the schematic cross-sectional structure along the line I-I of FIG. 1 includes: the package board 10; insulating layers 24 arranged on the package board 10; an input strip line 26 and an output strip line 28, which are arranged on the insulating layers 24; and the distribution/input matching circuit board 14, the input capacitor board 16, the semiconductor board 18, the output capacitor board 20, and the synthesis/output matching circuit board 22, which are individually arranged on the package board 10. The input strip line 26 is connected to a first terminal P1, and the output strip line 28 is connected to a second terminal P2. Note that, in FIG. 2, illustration of the frame member 12 is omitted.

Moreover, on the distribution/input matching circuit board 14, impedance matching adjusting patterns 42a, 42b, 44a and 44b for adjusting impedance matching in response to the change of the number of plural FET cells may be provided adjacent to the distribution/input matching circuits 32. Moreover, on the synthesis/output matching circuit board 22, impedance matching adjusting patterns 46a, 46b, 48a, 48b and 50 for adjusting the impedance matching in response to the change of the number of plural FET cells may be provided adjacent to the synthesis/output matching circuits 34.

Figure 3:
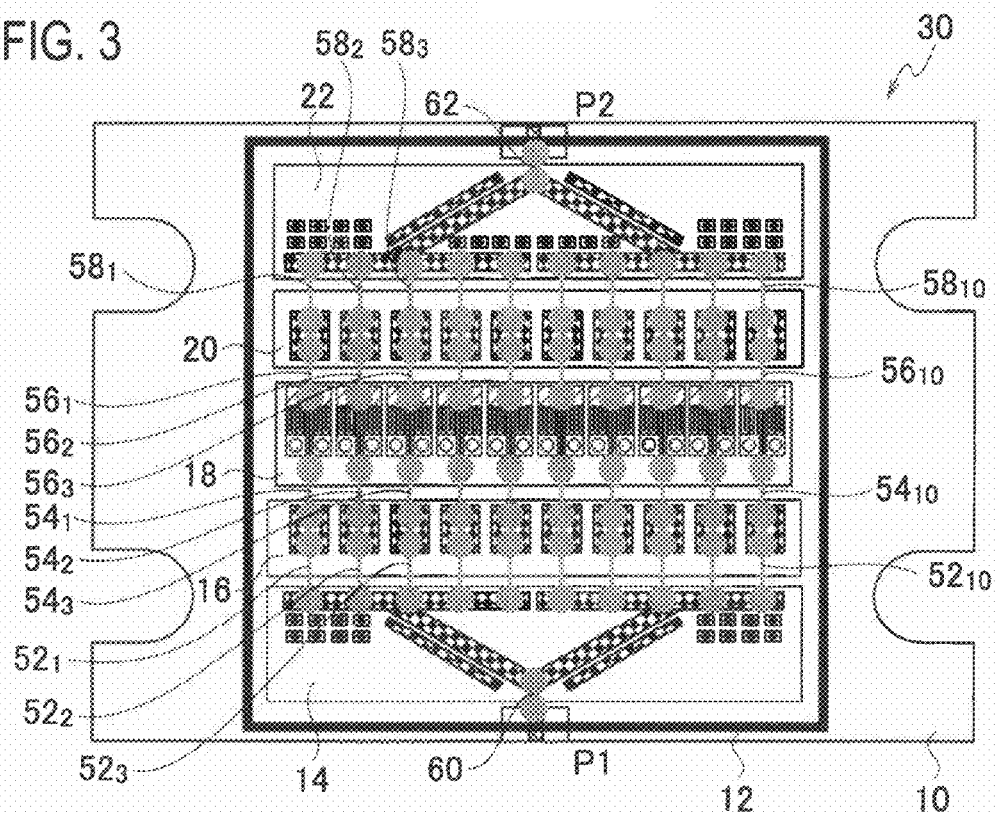
FIG. 3 is a schematic plane pattern configuration diagram at a time of a 100% connection in the high frequency semiconductor device according to the first embodiment.

In the high frequency semiconductor device 30 according to the first embodiment, a schematic plane pattern configuration when bonding wires 52, 54, 56 and 58 are connected fully (in 100%) to one another is illustrated as shown in FIG. 3. Here, the bonding wire 52 is a generic name of bonding wires $52_1, 52_2, \ldots$, and $52_{10}$, the bonding wire 54 is a generic name of bonding wires $54_1, 54_2, \ldots$, and $54_{10}$, the bonding wire 56 is a generic name of bonding wires $56_1, 56_2, \ldots$, and $56_{10}$, and the bonding wire 58 is a generic name of bonding wires $58_1, 58_2, \ldots$, and $58_{10}$.

Figure 4:
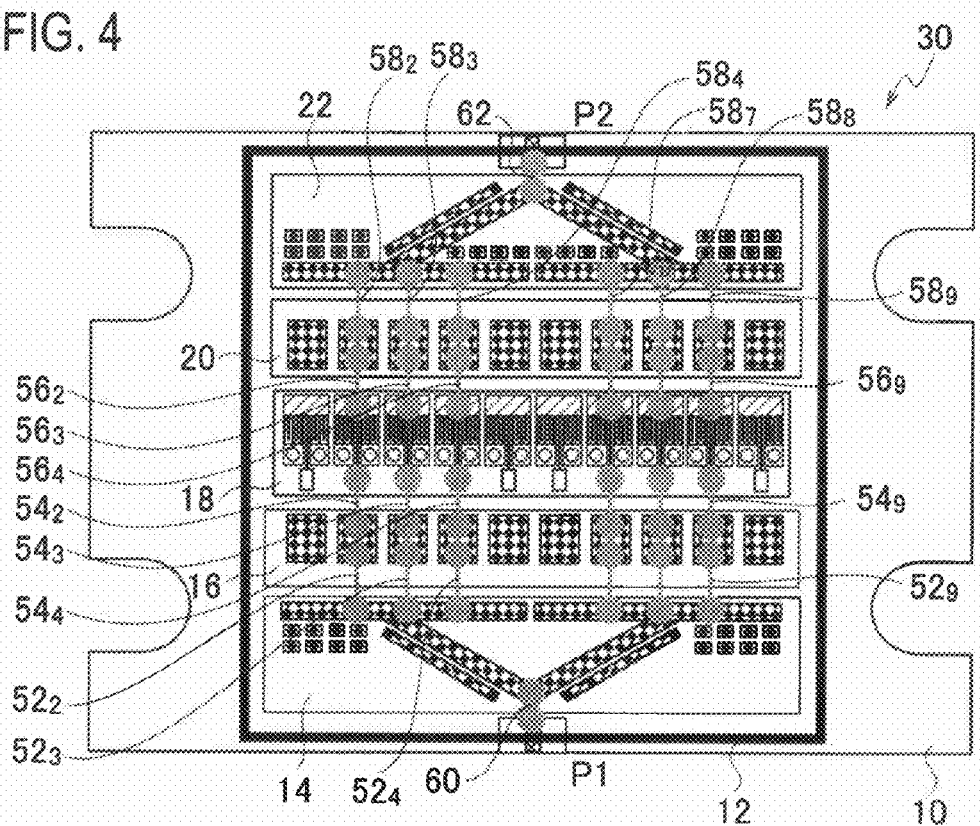
FIG. 4 is a schematic plane pattern configuration diagram at a time of a 60% connection in the high frequency semiconductor device according to the first embodiment.

A schematic plane pattern configuration when the bonding wires 52, 54, 56 and 58 are connected in 60% to one another is illustrated as shown in FIG. 4. In this case, as shown in FIG. 4, only the bonding wires $52_2, 52_3, 52_4, 52_7, 52_8$ and $52_9$, the bonding wires $54_2, 54_3, 54_4, 54_7, 54_8$ and $54_9$, the bonding wires $56_2, 56_3, 56_4, 56_7, 56_8$ and $56_9$ and the bonding wires $58_2, 58_3, 58_4, 58_7, 58_8$ and $58_9$ are connected to one another.

In the high frequency semiconductor device 30 according to the first embodiment, the semiconductor board 18 that mounts ten FET cells thereon is used. Accordingly, on each of sides of the semiconductor board 18, which are defined symmetrically while taking, as a center, a connection point between the distribution/input matching circuits 32 and the input transmission line patterns 36, one, three and five bonding wires are connected to the others, whereby, for example, connection forms of 20%, 60% and 100% can be formed. In a similar way, on each of sides defined symmetrically while taking, as a center, a connection point between the output transmission line patterns 38 and the synthesis/output matching circuits 34, one, three and five bonding wires are connected to the others, whereby, for example, connection forms of 20%, 60% and 100% can be formed.

A reason why one, three and five bonding wires are connected to the others on each of the sides defined symmetrically while taking, as the center, the connection point between the distribution/input matching circuits 32 and the input transmission line patterns 36 as described above is that branching from the distribution/input matching circuits 32 formed of a Wilkinson-type circuit or the like is made to be equalized. In a similar way, a reason why one, three and five bonding wires are connected to the others on each of the sides defined symmetrically while taking, as the center, the connection point between the output transmission line patterns 38 and the synthesis/output matching circuits 34 is that branching from the synthesis/output matching circuits 34 formed of a Wilkinson-type circuit or the like is made to be equalized.

In the high frequency semiconductor device 30 according to the first embodiment, for example, in the case of using a semiconductor board 18 that mounts twenty FET cells thereon, one, three and five bonding wires are connected to the others on each of the sides defined symmetrically while taking, as the center, the connection point between the distribution/input matching circuits 32 and the input transmission line patterns 36, whereby, for example, connection forms of 10%, 30% and 50% can be formed. In a similar way, one, three and five bonding wires are connected to the others on each of the sides defined symmetrically while taking, as the center, the connection point between the output transmission line patterns 38 and the synthesis/output matching circuits 34, whereby, for example, connection forms of 10%, 30% and 50% can be formed.

Figure 5:
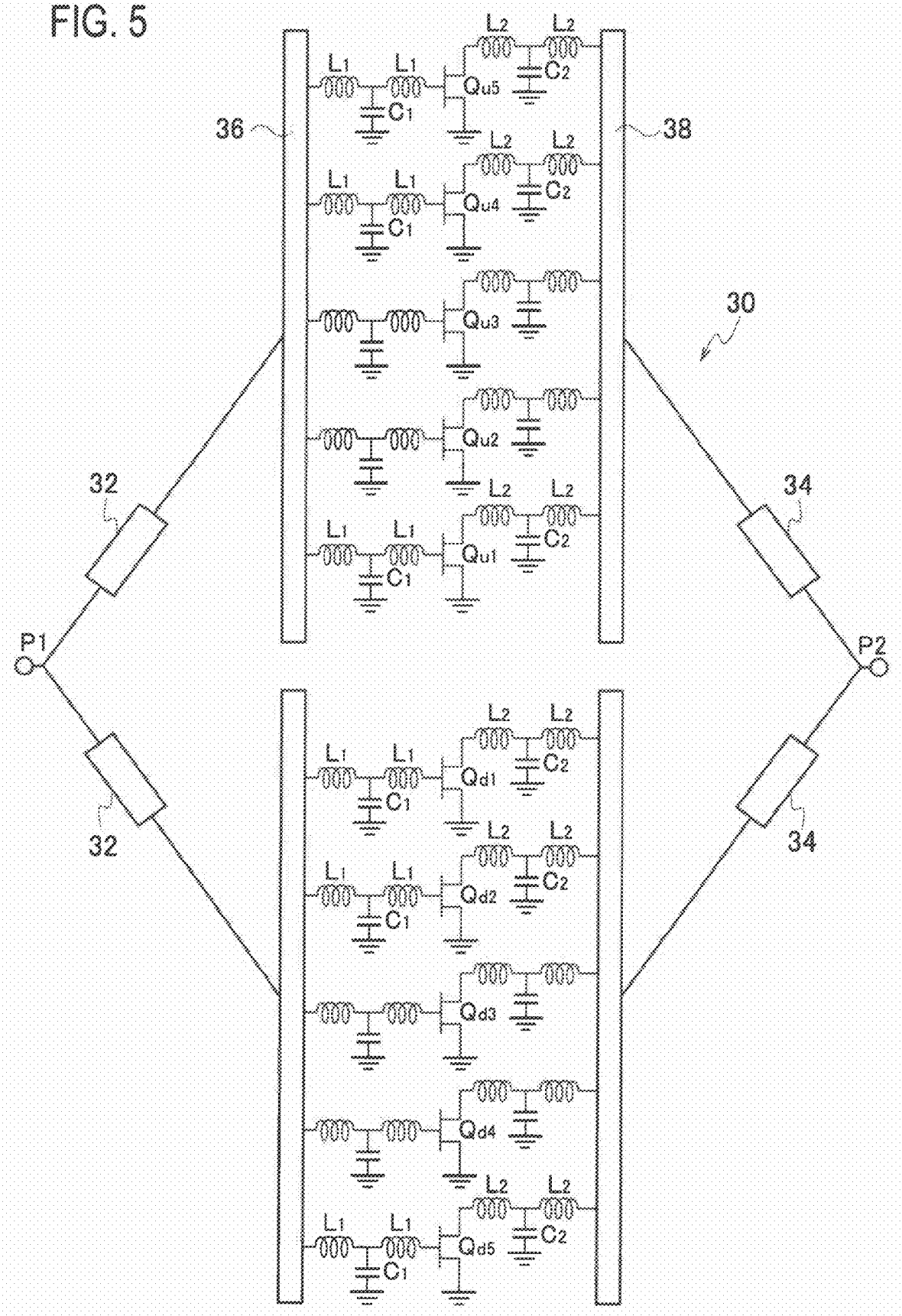
FIG. 5 is a schematic circuit configuration diagram at the time of the 100% connection in the high frequency semiconductor device according to the first embodiment.
Figure 6:
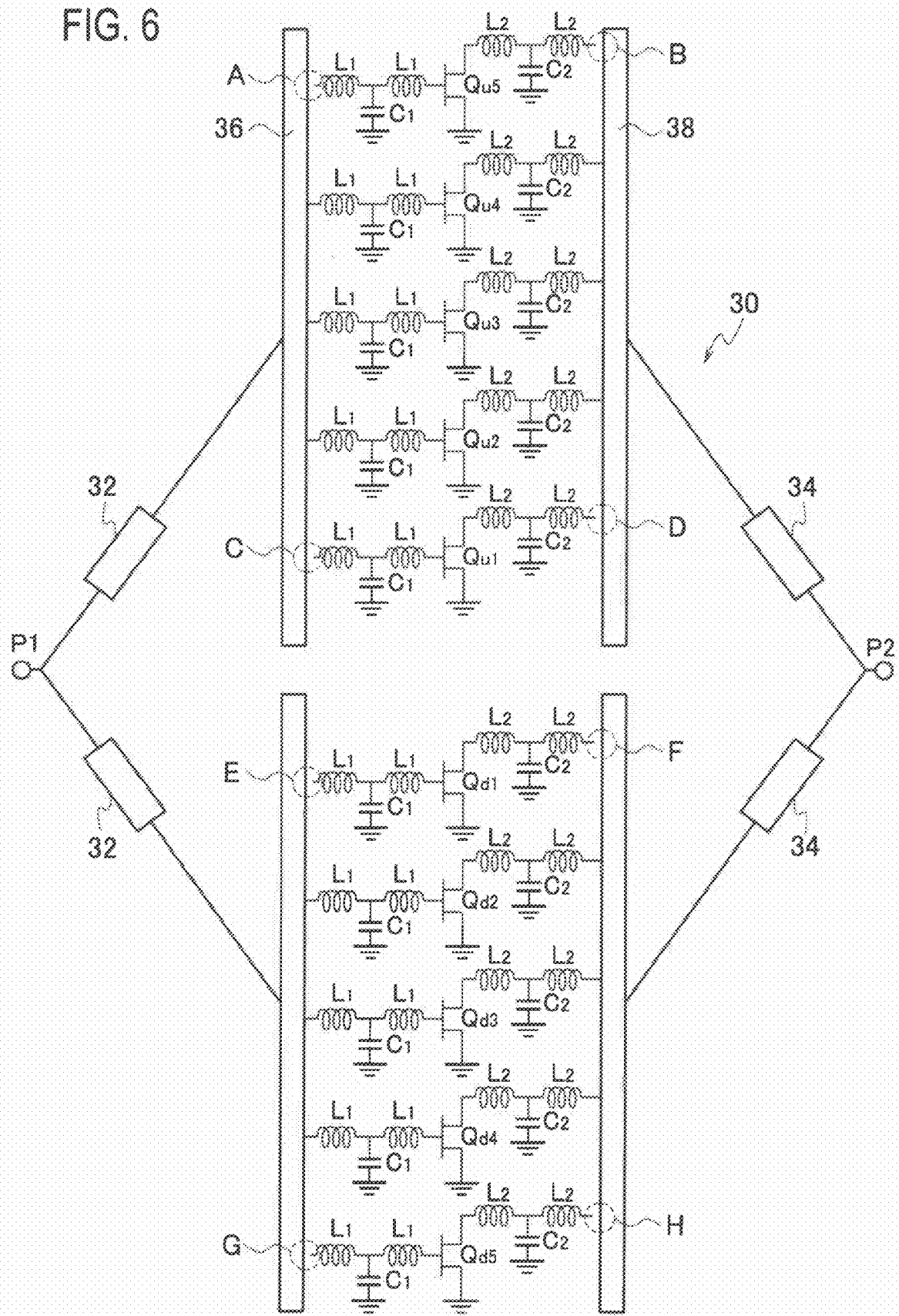
FIG. 6 is a schematic circuit configuration diagram at the time of the 60% connection in the high frequency semiconductor device according to the first embodiment.

Moreover, in the high frequency semiconductor device 30 according to the first embodiment, a schematic circuit configuration when the bonding wires 52, 54, 56 and 58 are connected in 100% to one another is illustrated as shown in FIG. 5, and a schematic circuit configuration when the bonding wires 52, 54, 56 and 58 are connected in 60% to one another is illustrated as shown in FIG. 6. Specifically, the distribution/input matching circuits 32 are connected to the first terminal P1, and the input transmission line patterns 36 are connected to the distribution/input matching circuits 32. Moreover, input matching circuits, each of which is illustrated by a capacitor C1 and two inductors L1, are connected between the input transmission line patterns 36 and FET cells $Q_{u1}, Q_{u2} \ldots, Q_{u5}$ and $Q_{d1}, Q_{d2} \ldots Q_{d5}$. Here, the capacitor C1 is a capacitor corresponding to each of the input capacitor cells 40 arranged on the input capacitor board 16, and the two inductors L1 are inductors corresponding to each of the bonding wires 52 and each of the bonding wires 54.

In a similar way, the synthesis/output matching circuits 34 are connected to the second terminal P2, and the output transmission line patterns 38 are connected to the synthesis/output matching circuits 34. Moreover, output matching circuits, each of which is illustrated by a capacitor C2 and two inductors L2, are connected between the output transmission line patterns 38 and the FET cells $Q_{u1}, Q_{u2} \ldots, Q_{u5}$ and $Q_{d1}, Q_{d2} \ldots, Q_{d5}$. Here, the capacitor C2 is a capacitor corresponding to each of the output capacitor cells 41 arranged on the output capacitor board 20, and the two inductors L2 are inductors corresponding to each of the bonding wires 56 and each of the bonding wires 58.

In the high frequency semiconductor device 30 according to the first embodiment, the input transmission line patterns 36 and the plurality of input capacitor cells 40 are connected to each other by the bonding wires 52, the plurality of input capacitor cells 40 and the plurality of FET cells FET1 to FET10 are connected to each other by the bonding wires 54, the plurality of FET cells FET1 to FET10 and the plurality of output capacitor cells 41 are connected to each other by the bonding wires 56, and the plurality of output capacitor cells 41 and the output transmission line patterns 38 are connected to each other by the bonding wires 58. In the event where these patterns and components are connected to one another in such a manner, some of the plurality of FET cells FET1 to FET10 are disconnected not to operate in response to the desired output power value, whereby the gate electrode length can be substantially adjusted.

Moreover, in the high frequency semiconductor device 30 according to the first embodiment, in the event where the input transmission line patterns 36 and the plurality of input capacitor cells 40 are connected to each other by the bonding wires 52, the plurality of input capacitor cells 40 and the plurality of FET cells FET1 to FET10 are connected to each other by the bonding wires 54, the plurality of FET cells FET1 to FET10 and the plurality of output capacitor cells 41 are connected to each other by the bonding wires 56, and the plurality of output capacitor cells 41 and the output transmission line patterns 38 are connected to each other by the bonding wires 58, when the desired output power value is small, the bonding wires connected to some of the plurality of FET cells FET1 to FET10 are detached not to allow the operation of some of the FET cells concerned, whereby the gate electrode length can also be shortened. For example, in FIG. 6, the bonding wires in portions denoted by reference symbols A, B, C, D, E, F, G and H are detached, whereby the gate electrode length can be substantially shortened by 40%, and the output power value can be adjusted to 60%.

Note that, in FIG. 3 and FIG. 4, the input strip line 26 on the first terminal P1 and the distribution/input matching circuits 32 are connected to each other by a bonding wire 60, and the output strip line 28 on the second terminal P and the synthesis/output matching circuits 34 are connected to each other by a bonding wire 62.

Experimental Results

Characteristics of a third-order intermodulation distortion IM3 (dBc) and efficiency PAE (%) with respect to output power Pout_s.c.l (dBm) are shown in FIG. 7 to FIG. 10. Here, the third-order intermodulation distortion IM3 is written as a ratio of each of signal levels to be described below with respect to a signal level of a fundamental wave (frequency f1 or f2). The signal levels are of signals with frequencies (2f2−f1) and (2f1−f2), which are outputted owing to nonlinearity of the high frequency semiconductor device when two input signals (f1 and f2; f1−f2=several ten megahertz) with frequencies substantially equal to each other are supplied thereto.

Figure 7:
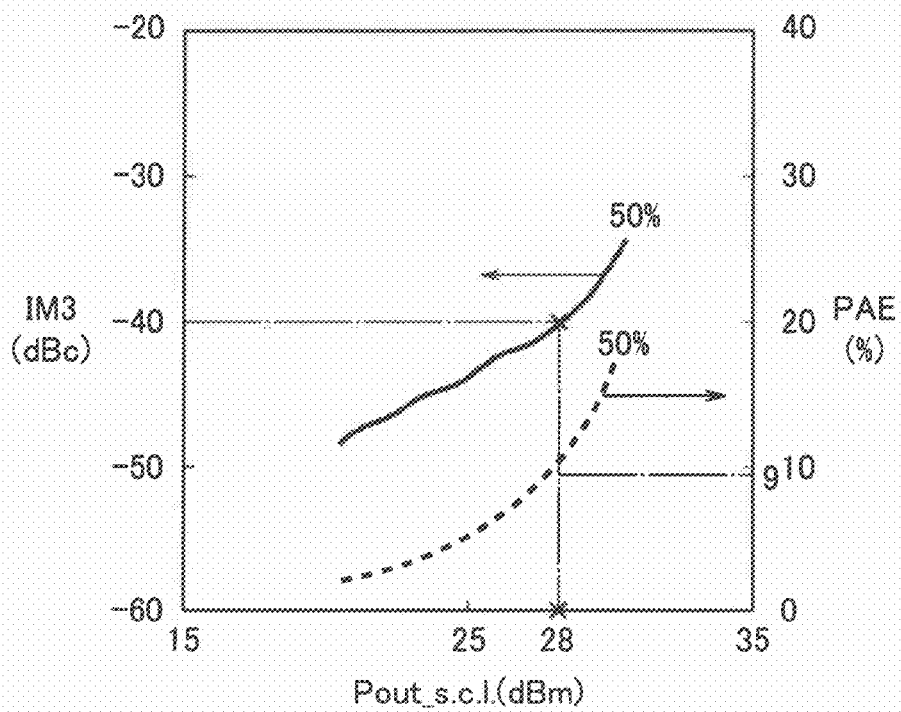
FIG. 7 is characteristic examples of a third-order intermodulation distortion IM3 (dBc) and efficiency PAE (%) with respect to output power Pout_s.c.l (dBm) in a case where a drain current Ids is set at 50% of a saturation drain current Idss in the high frequency semiconductor device according to the first embodiment.

Characteristic examples of the third-order intermodulation distortion IM3 (dBc) and the efficiency PAE (%) with respect to the output power Pout_s.c.l (dBm) in the case where a drain current Ids is set at 50% of a saturation drain current Idss in the high frequency semiconductor device according to the first embodiment are illustrated as shown in FIG. 7. In FIG. 7, it is understood that, when the desired output power Pout_s.c.l (dBm) is 28 dBm, the efficiency PAE, which is equal to 9%, is obtained while satisfying a relationship in which the third-order intermodulation distortion IM3 is smaller than −40 dBc.

Figure 8:
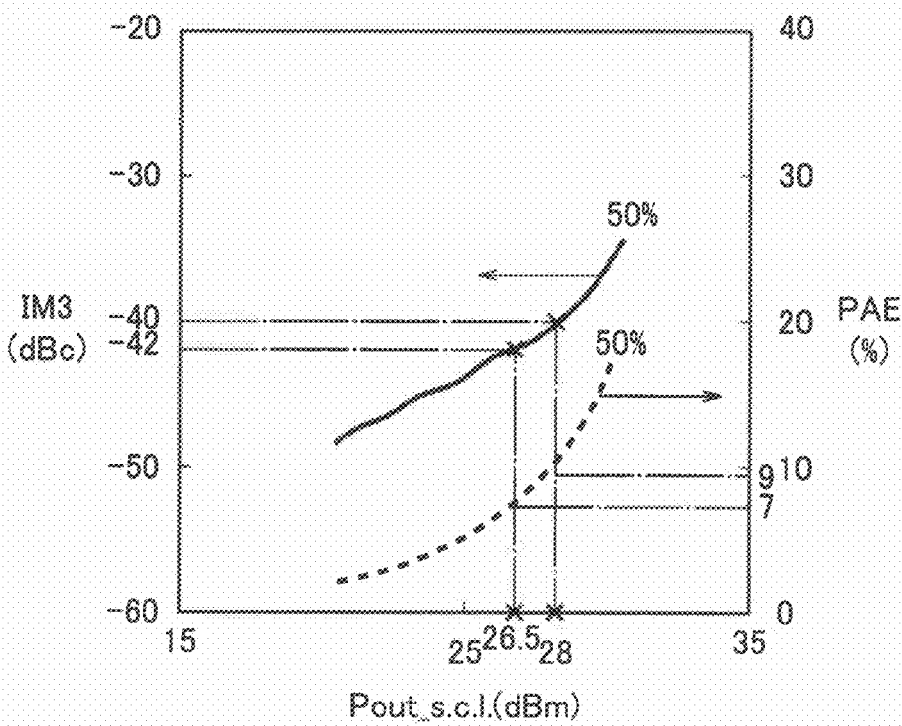
FIG. 8 is characteristic examples of the third-order intermodulation distortion IM3 (dBc) and the efficiency PAE (%) with respect to the output power Pout_s.c.l (dBm) in the case where the drain current Ids is set at 50% of the saturation drain current Idss in the high frequency semiconductor device according to the first embodiment.

Meanwhile, as shown in FIG. 8, it is understood that, when the desired output power Pout_s.c.l (dBm) is 26.5 dBm in the same characteristic example as that in FIG. 7, the efficiency PAE is lowered to 7% while satisfying a relationship in which the value of the third-order intermodulation distortion IM3 is −42 dBc. Specifically, as shown in FIG. 8, it is understood that, in the case where the value of the desired output power Pout_s.c.l (dBm) is lowered from 28 dBM to 26.5 dBm, the value of the third-order intermodulation distortion IM3 is sufficiently lower than −40 dBc; however, the efficiency PAE is lowered from 9% to 7%.

Characteristic examples of the third-order intermodulation distortion IM3 (dBc) and the efficiency PAE (%) with respect to the output power Pout_s.c.1 (dBm) in the case where the drain current Ids is set at 35% of the saturation drain current Idss in the high frequency semiconductor device according to the first embodiment are illustrated as shown in FIG. 9. In FIG. 9, characteristic examples which correspond to FIG. 7 showing the case where the drain current Ids is set at 50% of the saturation drain current Idss are also shown for comparison. In FIG. 9, it is understood that, in the case where the desired output power Pout_s.c.1 (dBm) is 26.5 dBm, when the drain current Ids is lowered to 35% of the saturation drain current Idss in order to maintain the efficiency PAE at 9%, the value of the third-order intermodulation distortion IM3 is deteriorated to −38 dBc. Specifically, as shown in FIG. 9, it is understood that, when the drain current Ids is lowered from 50% of the value of the saturation drain current Idss to 35% thereof while maintaining the desired output power Pout_s.c.1 (dBm) at 26.5 dBm, the value of the third-order intermodulation distortion IM3 is deteriorated from −42 dBc to −38 dBc.

Characteristic examples of the third-order intermodulation distortion IM3 (dBc) and the efficiency PAE (%) with respect to the output power Pout_s.c.1 (dBm) in the case where, in the high frequency semiconductor device according to the first embodiment, the drain current Ids is set at 35% of the saturation drain current Idss, and the total gate electrode length WG is reduced by 30%, are illustrated as shown in FIG. 10. In FIG. 10, characteristic examples which correspond to FIG. 9 showing the case where the drain current Ids is set at 35% of the saturation drain current Idss and the total gate electrode length WG is set at 100% are also shown for comparison. In FIG. 10, it is understood that, when the desired output power Pout_s.c.1 (dBm) is 26.5 dBm, the total gate electrode length WG is reduced by 30%, whereby the efficiency PAE, which is equal to or higher than 9%, is obtained while satisfying the relationship in which the third-order intermodulation distortion IM3 is smaller than −40 dBc. Specifically, the following is understood. As shown in FIG. 9, when the drain current Ids is lowered from 50% of the value of the saturation drain current Idss to 35% thereof in order to raise the value of the efficiency PAE from 7% to 9% while maintaining the desired output power Pout_s.c.1 (dBm) at 26.5 dBm, the value of the third-order intermodulation distortion IM3 is deteriorated from −42 dBc to −38 dBc. Meanwhile, as shown in FIG. 10, when the total gate electrode length WG is reduced from 100% to 70% while maintaining the desired output power Pout_s.c.1 (dBm) at 26.5 dBm, the value of the third-order intermodulation distortion IM3 is improved from −38 dBc to −40 dBc, and the efficiency PAE, which is equal to or higher than 9%, is obtained.

When such experimental results as described above are summarized, the following is understood. In the high frequency semiconductor device according to the first embodiment, when the desired output power Pout_s.c.1 (dBm) is 28 dBM, the efficiency PAE, which is equal to 9%, is obtained while satisfying the relationship in which the third-order intermodulation distortion IM3 is smaller than −40 dBc. However, when the desired output power Pout_s.c.1 (dBm) is 26.5 dBM, the efficiency PAE is lowered to 7% while excessively satisfying the relationship in which the third-order intermodulation distortion IM3 is smaller than −40 dBc. When the current is reduced in order to maintain the efficiency PAE at 9%, the third-order intermodulation distortion IM3 is deteriorated to −38 dBc. Meanwhile, the total gate electrode length WG is reduced by 30% while maintaining the desired output power Pout_s.c.1 (dBm) at 26.5 dBm, whereby the efficiency PAE, which is equal to or higher than 9%, is obtained while satisfying the relationship in which the third-order intermodulation distortion IM3 is smaller than −40 dBc.

In the high frequency semiconductor device according to the first embodiment, the drain current Ids is not lowered with respect to the saturation drain current Idss, but the total gate electrode length WG is reduced, whereby such high efficiency of 9% or more can be obtained while satisfying the relationship in which the value of the third-order intermodulation distortion IM3 is as low as −40 dBc.

A usual microwave semiconductor power device is designed so that the efficiency PAE and the third-order intermodulation distortion IM3 can be optimized under conditions of specific output level and bias. Specifically, the best performance intrinsic to the device is derived only at the output level and bias point concerned.

In a general microwave semiconductor device for high power amplifiers, the structure is designed so that the efficiency PAE and the third-order intermodulation distortion IM3 shows the best performance under conditions with a specified output level and bias point. Namely, the best performance intrinsic to the device is derived only at the output level and bias point concerned.

As opposed to this, with respect to the power level at which the device is operated, such a bias current level is not changed, but the total gate electrode length WG is changed, whereby the best performance intrinsic to the device, that is, the maximum efficiency and the minimum distortion ratio can be derived at the power level at which the device is operated.

(Element Structure)

In the high frequency semiconductor device according to the first embodiment, an enlarged view of a schematic plane pattern configuration of the semiconductor board 18 is illustrated as shown in FIG. 11A, and an enlarged view of a portion J of FIG. 11A is illustrated as shown in FIG. 11B. Moreover, examples of schematic cross-sectional structure configurations along a line II-II of FIG. 11B, showing Configuration examples 1 to 4 of the high frequency semiconductor device according to the first embodiment, are illustrated as shown in FIG. 12 to FIG. 15, respectively. Furthermore, a schematic bird's-eye structure of the high frequency semiconductor device according to the first embodiment is illustrated as shown in FIG. 16.

Figure 16:
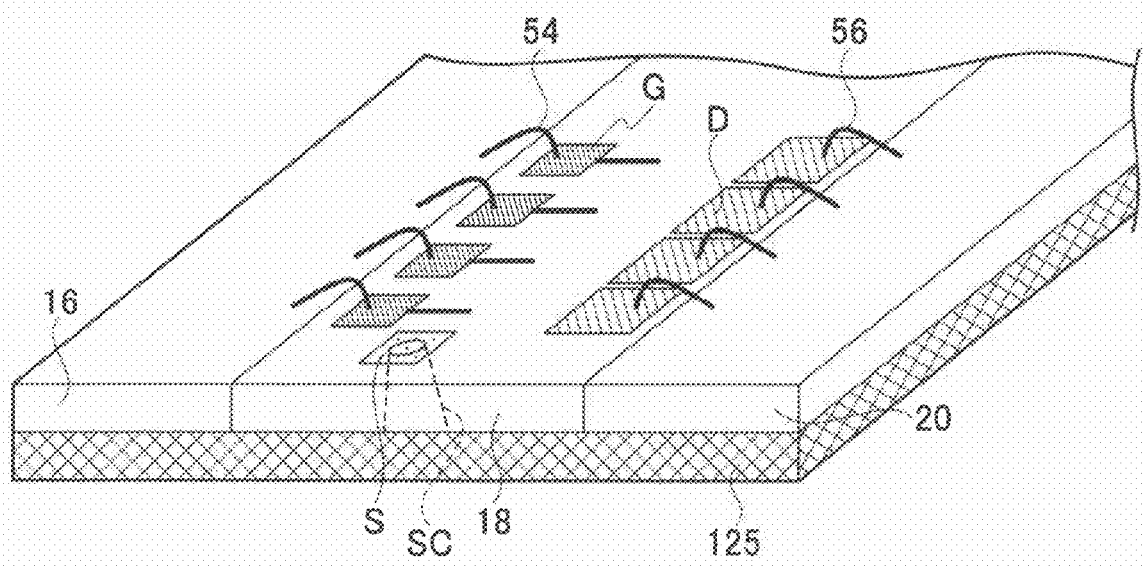
FIG. 16 is a schematic bird's-eye view of the high frequency semiconductor device according to the first embodiment.

In the high frequency semiconductor device according to the first embodiment, as shown in FIG. 11A, FIG. 11B and FIG. 16, the plurality of FET cells FET1 to FET10 include: a semi-insulating substrate 110; gate finger electrodes 124, source finger electrodes 120, and drain finger electrodes 122, which are arranged on a first surface of the semi-insulating substrate 110, and each of which has a plurality of fingers; a plurality of gate terminal electrodes G1 to G10, and pluralities of source terminal electrodes S11, S12, S21, S22 . . . , S101 and S102 and drain terminal electrodes D1 to D10, which are arranged on the first surface of the semi-insulating substrate 110, and are formed by bundling a plurality of fingers for each of the gate finger electrodes 124, the source finger electrodes 120 and the drain finger electrodes 122; VIA holes SC11, SC12, SC21, SC22 . . . , SC101 and SC102, which are arranged in lower portions of the source terminal electrodes S11, S12, S21, S22 . . . , S101 and S102; and a ground electrode 125, which is arranged on a second surface on an opposite side with the first surface of the semi-insulating substrate 110, and is connected to the source terminal electrodes S11, S12, S21, S22 . . . , S101 and 5102 through the VIA holes SC11, SC12, SC21, SC22 . . . , SC101 and SC102.

As shown in FIG. 16, the bonding wires 54 are connected to the gate terminal electrodes G, the bonding wires 56 are connected to the drain terminal electrodes D, the VIA holes SC are formed in the lower portions of the source terminal electrodes S, and the source terminal electrodes S are connected to the ground electrode 125 through electrode layers (not shown) formed on inner walls of the VIA holes SC.

As shown in FIG. 11, the gate electrode length of the FET cell unit is represented as Wg. The number Ng of gate lines in each of the FET cells FET1 to FET10 is ten, and the number Nc of cells of the FET cell unit is ten. Hence, in the example shown in FIG. 11, the total gate electrode length WG is equal to 100 Wg based on an expression of: Wg×Ng×Nc=Wg×10×10.

The semi-insulating substrate is any of a GaAs substrate, a SiC substrate, a GaN substrate, a substrate obtained by forming a GaN epitaxial layer on the SiC substrate, a substrate obtained by forming a heterojunction epitaxial layer made of GaN/AlGaN on the SiC substrate, a sapphire substrate and a diamond substrate.

Configuration Example 1

Figure 12:
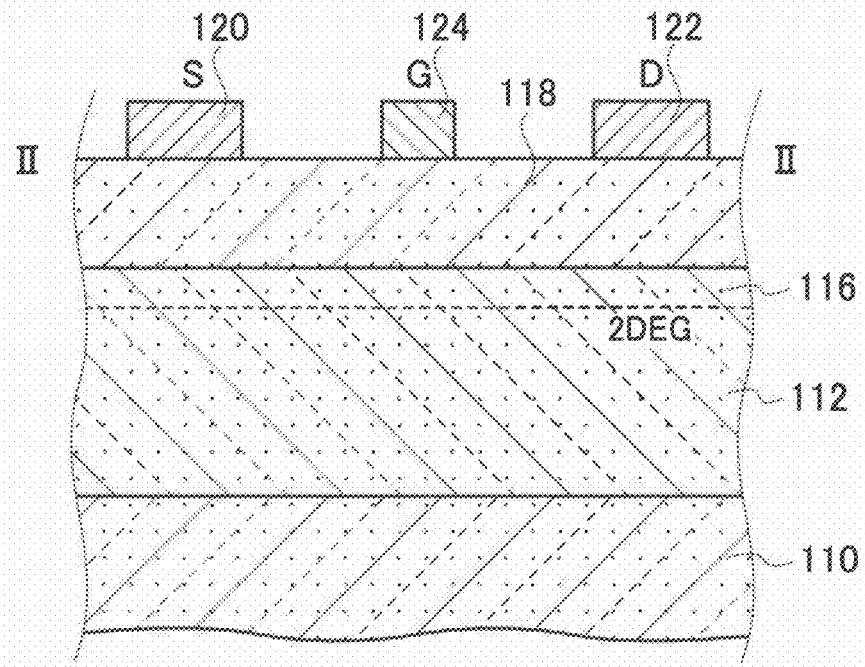
FIG. 12 is a schematic cross-sectional structure diagram along a line II-II of FIG. 11B, showing Configuration example 1 of the high frequency semiconductor device according to the first embodiment.

As shown in FIG. 12, as a schematic cross-sectional configuration along the line II-II of FIG. 11B, Configuration example 1 of the semiconductor device according to the first embodiment includes: the semi-insulating substrate 110; a nitride compound semiconductor layer 112 arranged on the semi-insulating substrate 110; an aluminum gallium nitride layer ($Al_xGa_{1-x}N$) ($0.1 \leq x \leq 1$) 118 arranged on the nitride compound semiconductor layer 112; the source finger electrode 120, the gate finger electrode 124 and the drain finger electrode 122, which are arranged on the aluminum gallium nitride layer ($Al_xGa_{1-x}N$) ($0.1 \leq x \leq 1$) 118. On an interface between the nitride compound semiconductor layer 112 and the aluminum gallium nitride layer ($Al_xGa_{1-x}N$) ($0.1 \leq x \leq 1$) 118, a two-dimensional electron gas (2DEG) layer 116 is formed. In Configuration example 1 shown in FIG. 12, a high electron mobility transistor (HEMT) is shown.

Configuration Example 2

Figure 13:
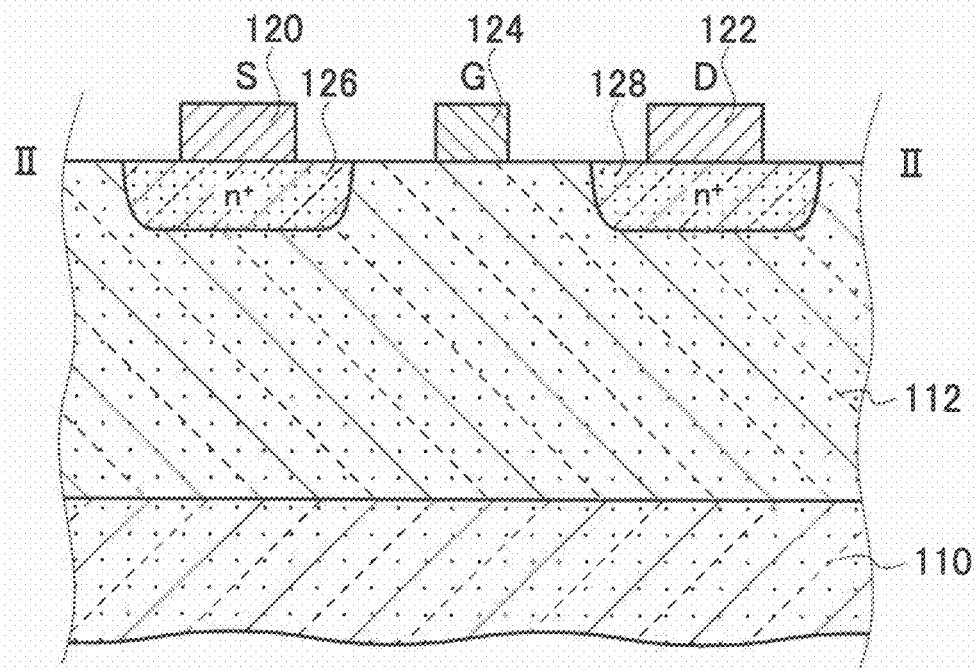
FIG. 13 is a schematic cross-sectional structure diagram along the line II-II of FIG. 11B, showing Configuration example 2 of the high frequency semiconductor device according to the first embodiment.

As shown in FIG. 13, as a schematic cross-sectional configuration along the line II-II of FIG. 11B, Configuration example 2 of the semiconductor device according to the first embodiment includes: the semi-insulating substrate 110; the nitride compound semiconductor layer 112 arranged on the semi-insulating substrate 110; a source region 126 and a drain region 128, which are arranged on the nitride compound semiconductor layer 112; and the source finger electrode 120 arranged on the source region 126, the gate finger electrode 124 arranged on the nitride compound semiconductor layer 112, and the drain finger electrode 122 arranged on the drain region 128. On an interface between the nitride compound semiconductor layer 112 and the gate finger electrode 124, a Schottky contact is formed. In Configuration example 2 shown in FIG. 13, a metal-semiconductor field effect transistor (MESFET) is shown.

Configuration Example 3

Figure 14:
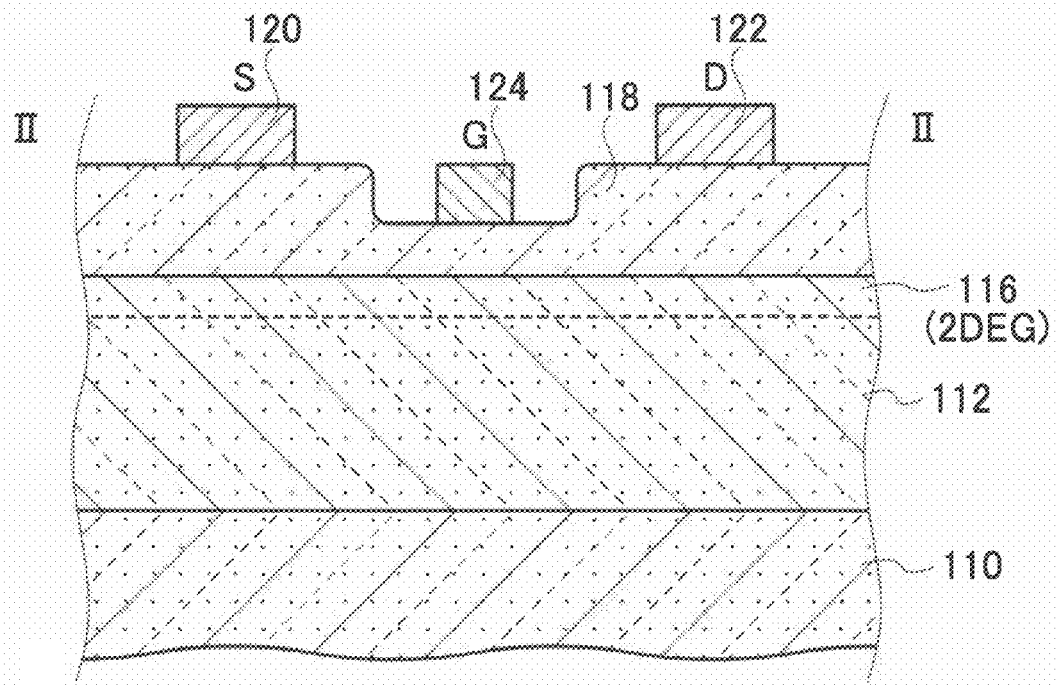
FIG. 14 is a schematic cross-sectional structure diagram along the line II-II of FIG. 11B, showing Configuration example 3 of the high frequency semiconductor device according to the first embodiment.

As shown in FIG. 14, as a schematic cross-sectional configuration along the line II-II of FIG. 11B, Configuration example 3 of the semiconductor device according to the first embodiment includes: the semi-insulating substrate 110; the nitride compound semiconductor layer 112 arranged on the semi-insulating substrate 110; the aluminum gallium nitride layer ($Al_xGa_{1-x}N$) ($0.1 \leq x \leq 1$) 118 arranged on the nitride compound semiconductor layer 112; the source finger electrode 120 and the drain finger electrode 122, which are arranged on the aluminum gallium nitride layer ($Al_xGa_{1-x}N$) ($0.1 \leq x \leq 1$) 118; and the gate finger electrode 124 arranged on a recessed portion on the aluminum gallium nitride layer ($Al_xGa_{1-x}N$) ($0.1 \leq x \leq 1$) 118. On an interface between the nitride compound semiconductor layer 112 and the aluminum gallium nitride layer ($Al_xGa_{1-x}N$) ($0.1 \leq x \leq 1$) 118, the 2DEG layer 116 is formed. In Configuration example 3 shown in FIG. 14, an HEMT is shown.

Configuration Example 4

Figure 15:
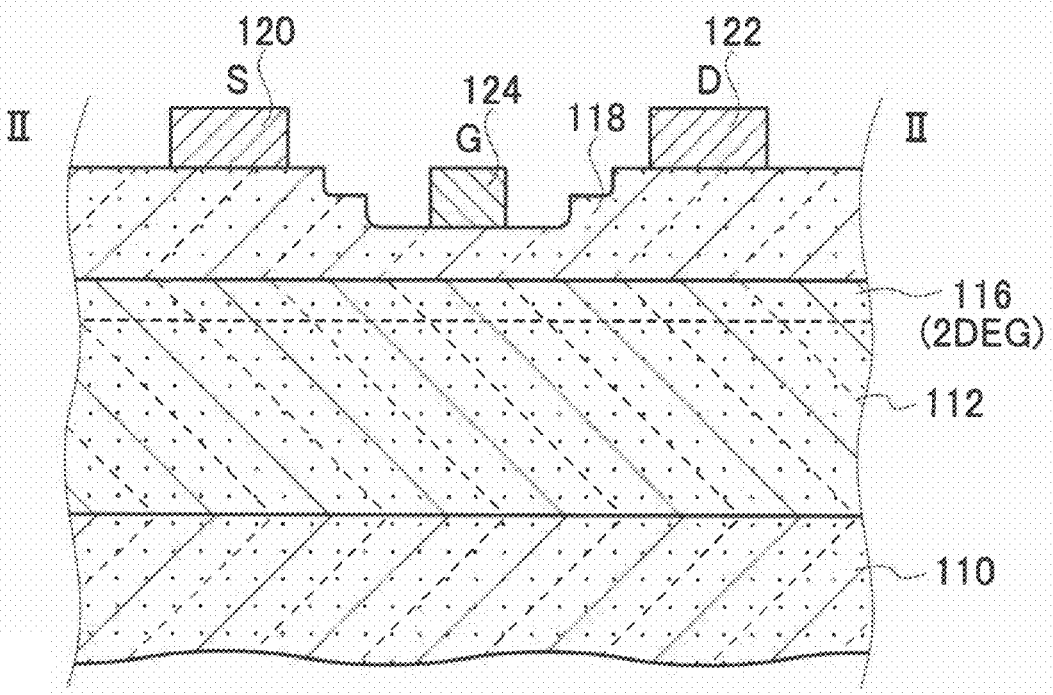
FIG. 15 is a schematic cross-sectional structure diagram along the line II-II of FIG. 11B, showing Configuration example 4 of the high frequency semiconductor device according to the first embodiment.

As shown in FIG. 15, as a schematic cross-sectional configuration along the line II-II of FIG. 11B, Configuration example 4 of the semiconductor device according to the first embodiment includes: the semi-insulating layer 110; the nitride compound semiconductor layer 112 arranged on the semi-insulating substrate 110; the aluminum gallium nitride layer ($Al_xGa_{1-x}N$) ($0.1 \leq x \leq 1$) 118 arranged on the nitride compound semiconductor layer 112; the source finger electrode 120 and the drain finger electrode 122, which are arranged on the aluminum gallium nitride layer ($Al_xGa_{1-x}N$) ($0.1 \leq x \leq 1$) 118; and the gate finger electrode 124 arranged on a two-stage recessed portion on the aluminum gallium nitride layer ($Al_xGa_{1-x}N$) ($0.1 \leq x \leq 1$) 118. On an interface between the nitride compound semiconductor layer 112 and the aluminum gallium nitride layer ($Al_xGa_{1-x}N$) ($0.1 \leq x \leq 1$) 118, the 2DEG layer 116 is formed. In Configuration example 4 shown in FIG. 15, an HEMT is shown.

Moreover, in the above-described embodiment, the nitride compound semiconductor layer 112 other than an active region is used as an electrically inactive element isolation region. Here, the active region is composed of the 2DEG layer 116 immediately under the source finger electrode 120, the gate finger electrode 124 and the drain finger electrode 122, of the 2DEG layer 116 between the source finger electrode 120 and the gate finger electrode 124, and of the 2DEG layer 116 between the drain finger electrode 122 and the gate finger electrode 124. In the above-described embodiment, the nitride compound semiconductor layer 122 other than this active region is used as the electrically inactive element isolation region.

In another method of forming the element isolation region, the element isolation region can also be formed by partial ion implantation into the aluminum gallium nitride layer ($Al_xGa_{1-x}N$) ($0.1 \leq x \leq 1$) 118 and the nitride compound semiconductor layer 112 in a depth direction. As ionic species, for example, nitrogen (N), argon (Ar) and the like can be applied. Moreover, a dose amount that follows the ion implantation is, for example, approximately $1 \times 10^{14}$ (ions/cm$^2$), and acceleration energy in this case is, for example, approximately 100 keV to 200 keV.

On the element isolation region and the device surface, an insulating layer (not shown) for passivation is formed. This insulating layer can be formed, for example, of a nitride film, an alumina ($Al_2O_3$) film, a silicon oxide film ($SiO_2$), a silicon oxynitride film and the like, which are deposited by a plasma enhanced vapor deposition (PECVD) method.

The source finger electrode 120 and the drain finger electrode 122 are formed, for example, Ti/Al and the like. The gate finger electrode 124 can be formed, for example, of Ni/Au and the like.

The ground electrode 125 includes a barrier metal layer, and a grounding metal layer arranged on the barrier metal layer; however, illustration thereof is omitted in FIG. 16. The barrier metal layer is composed, for example, of a Ti layer or a Ti/Pt layer, and the grounding metal layer is composed, for example, of an Au layer.

Hence, the ground electrode 125 may include any configuration of the Au layer, a Ti/Au layer, a Ti/W/Au layer and a Ti/Pt/Au layer. A thickness of the ground electrode 125 is, for example, approximately 5 μm to 30 μm.

Note that, in the high frequency semiconductor device according to the first embodiment, a longitudinal pattern length of the gate finger electrode 124, the source finger electrode 120 and the drain finger electrode 122 is set shorter as an operation frequency is increased from a microwave through a millimeter wave to a sub-millimeter wave. For example, in a millimeter wave band, the pattern length is approximately 25 μm to 50 μm.

Moreover, a width of the source finger electrode 120 is, for example, approximately 40 μm, a width of the source terminal electrodes S11, S12, S21, S22 . . . , S101 and S102 is, for example, approximately 100 μm. Furthermore, a formed with of the VIA holes SC11, SC12, SC21, SC22 . . . , SC101 and SC102 is, for example, approximately 10 μm to 40 μm.

In accordance with the high frequency semiconductor device according to the first embodiment, the number of active FET cells is changed by connecting and disconnecting the plurality of FET cells to one another in response to the desired output power value without preparing/controlling the power supply for each of the FET cells, whereby the total gate electrode length can be substantially changed. In such a way, the output power value can be adjusted at low cost.

Moreover, in accordance with the high frequency semiconductor device according to the first embodiment, the system is simplified, and a mass production effect is obtained, whereby the cost can be suppressed.

Second Embodiment

Figure 17:
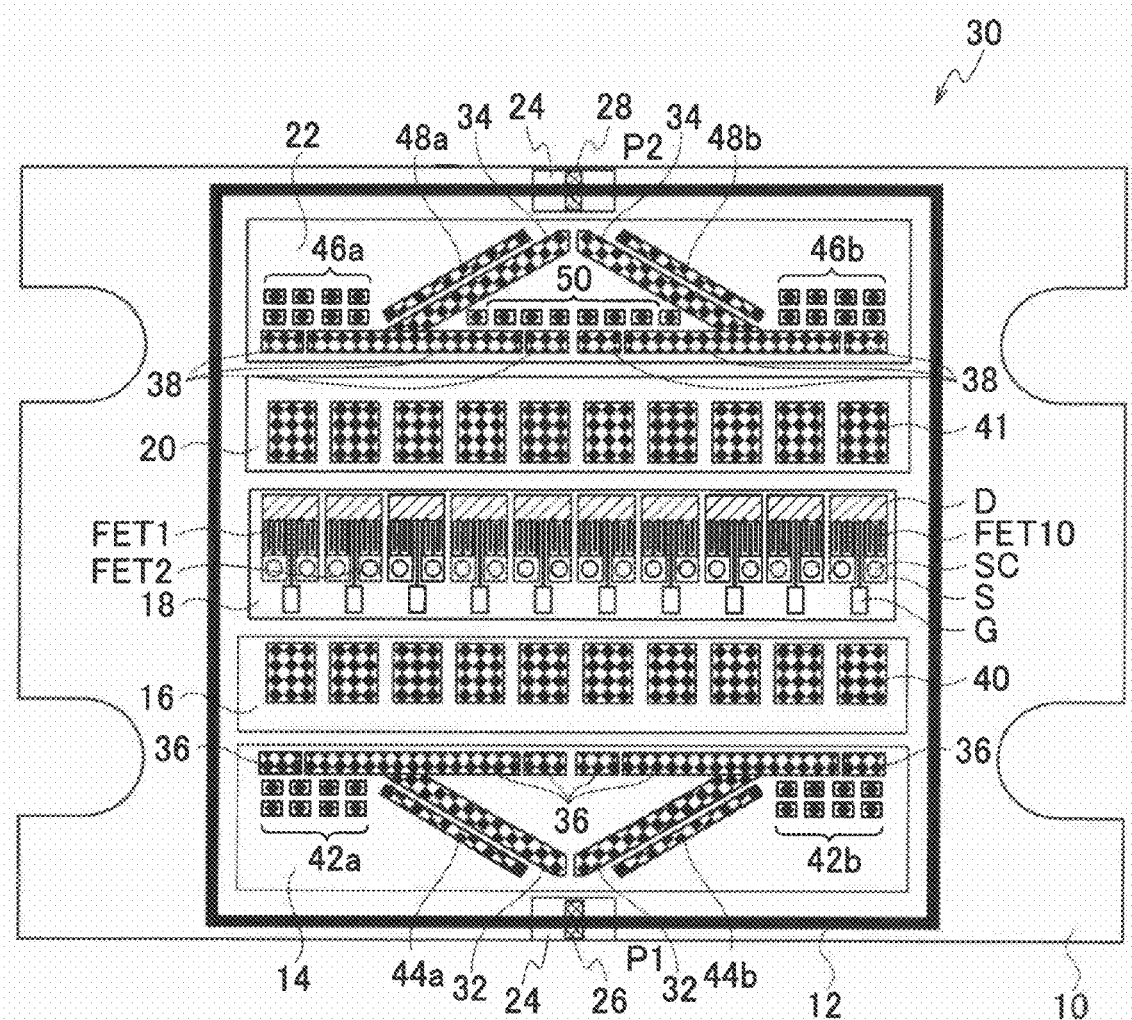
FIG. 17 is a schematic plane pattern configuration diagram of a high frequency semiconductor device according to a second embodiment.

A schematic plane pattern configuration of a high frequency semiconductor device 30 according to a second embodiment is illustrated as shown in FIG. 17.

Figure 18:
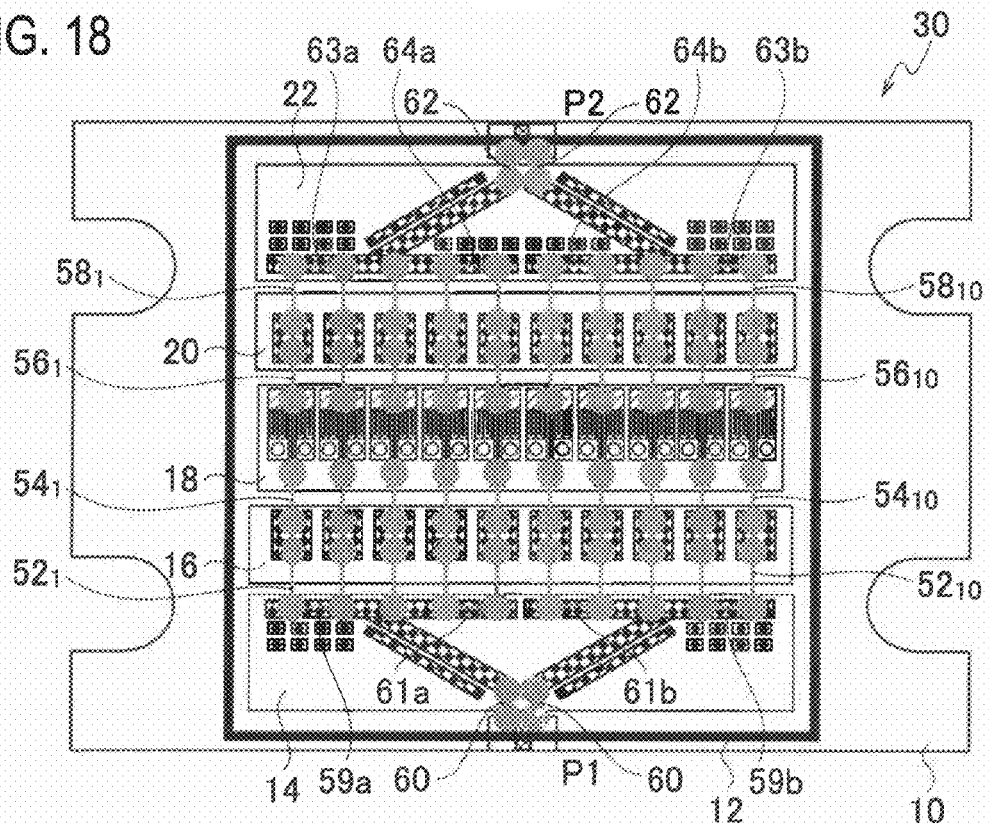
FIG. 18 is a schematic plane pattern configuration diagram at a time of a 100% connection in the high frequency semiconductor device according to the second embodiment.
Figure 19:
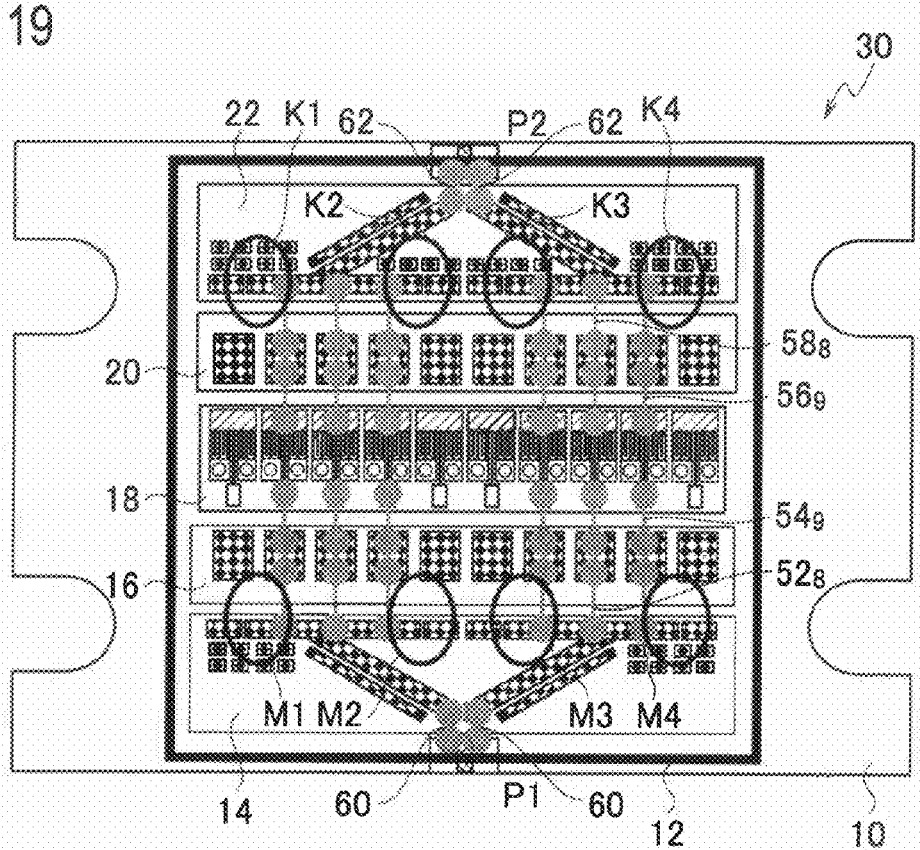
FIG. 19 is a schematic plane pattern configuration diagram at a time of a 60% connection in the high frequency semiconductor device according to the second embodiment.

In the high frequency semiconductor device 30 according to the second embodiment, a schematic plane pattern configuration at a time of a 100% connection is illustrated as shown in FIG. 18, and a schematic plane pattern configuration at a time of a 60% connection is illustrated as shown in FIG. 19.

In the high frequency semiconductor device 30 according to the second embodiment, as shown in FIG. 17 to FIG. 19, slits M1 to M4 are cut in the input transmission line patterns 36, and portions divided thereby are made connectable or disconnectable to one another, and slits K1 to K4 are cut in the output transmission line patterns 38, and portions divided thereby are made connectable or disconnectable to one another. In the case of allowing electrical connection of the slits M1 to M4, as shown in FIG. 18, bonding wires 59a, 61a, 61b and 59b are used, respectively. In a similar way, in the case of allowing electrical connection of the slits K1 to K4, as shown in FIG. 18, bonding wires 63a, 64a, 64b and 63b are used, respectively.

Moreover, in the high frequency semiconductor device 30 according to the second embodiment, as shown in FIG. 17 to FIG. 19, the pattern is divided also at a center portion of the distribution/input matching circuits 32 and a center portion of the synthesis/output matching circuits 34. Hence, in FIG. 18 and FIG. 19, the input strip line 26 on the first terminal P1 and the divided distribution/input matching circuits 32 are connected to each other by two bonding wires 60, and the output strip line 28 on the second terminal P2 and the divided synthesis/output matching circuits 34 are connected to each other by two bonding wires 62. Other configurations are similar to those of the first embodiment, and accordingly, a duplicate description is omitted.

In accordance with the high frequency semiconductor device according to the second embodiment, the slits M1 to M4 are cut in the input transmission line patterns 36, and the portions divided thereby are made connectable or disconnectable to one another, and the slits K1 to K4 are cut in the output transmission line patterns 38, and the portions divided thereby are made connectable or disconnectable to one another. In such a way, the number of active FET cells is changed by connecting and disconnecting the plurality of FET cells to one another in response to the desired output power value without preparing/controlling the power supply for each of the FET cells, whereby the total gate electrode length can be substantially changed. In such a way, the output power value can be adjusted at low cost.

Moreover, in accordance with the high frequency semiconductor device according to the second embodiment, the system is simplified, and the mass production effect is obtained, whereby the cost can be suppressed.

Third Embodiment

Figure 20:
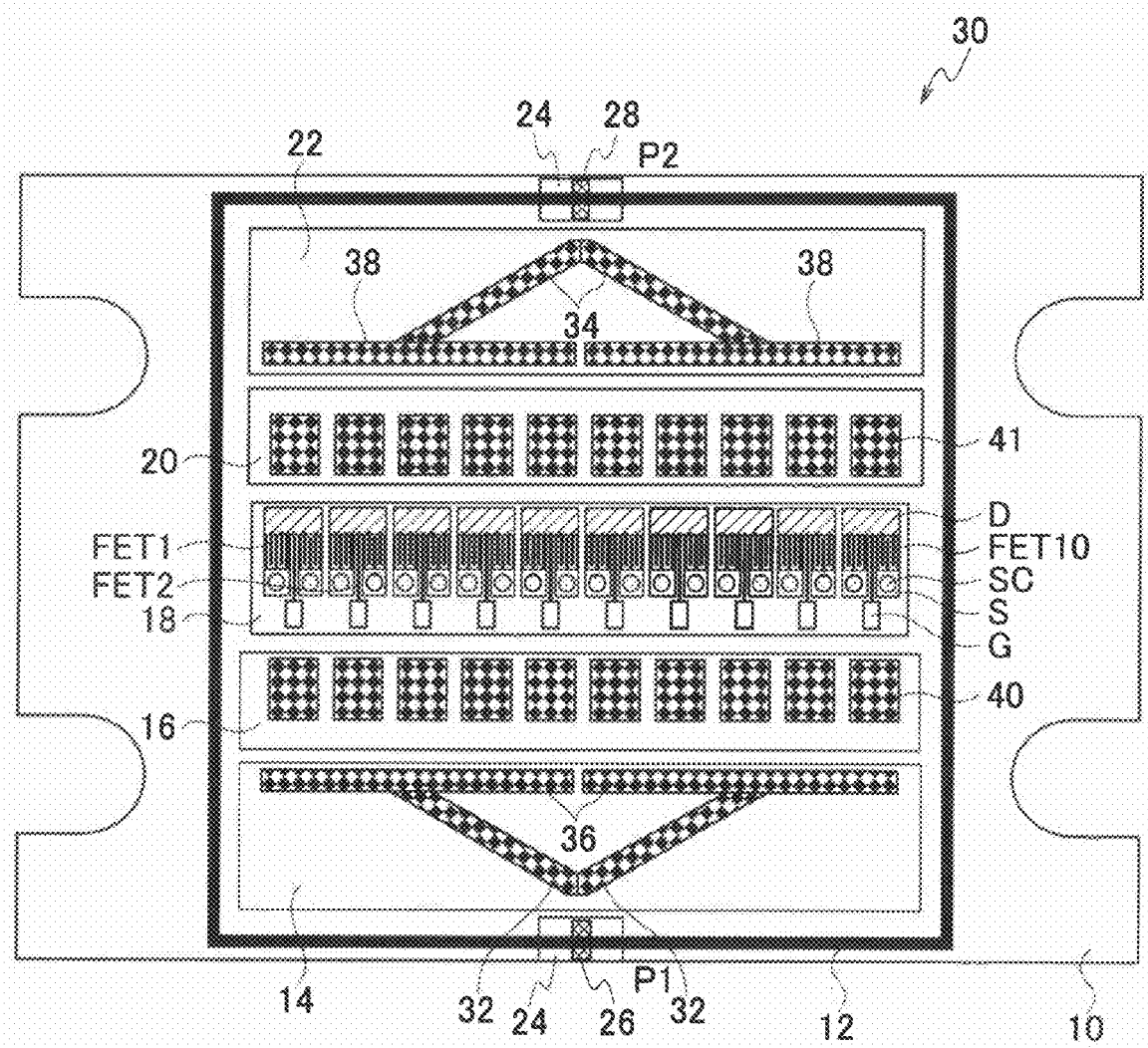
FIG. 20 is a schematic plane pattern configuration diagram of a high frequency semiconductor device according to a third embodiment.

A schematic plane pattern configuration of a high frequency semiconductor device 30 according to a third embodiment is illustrated as shown in FIG. 20.

Figure 21:
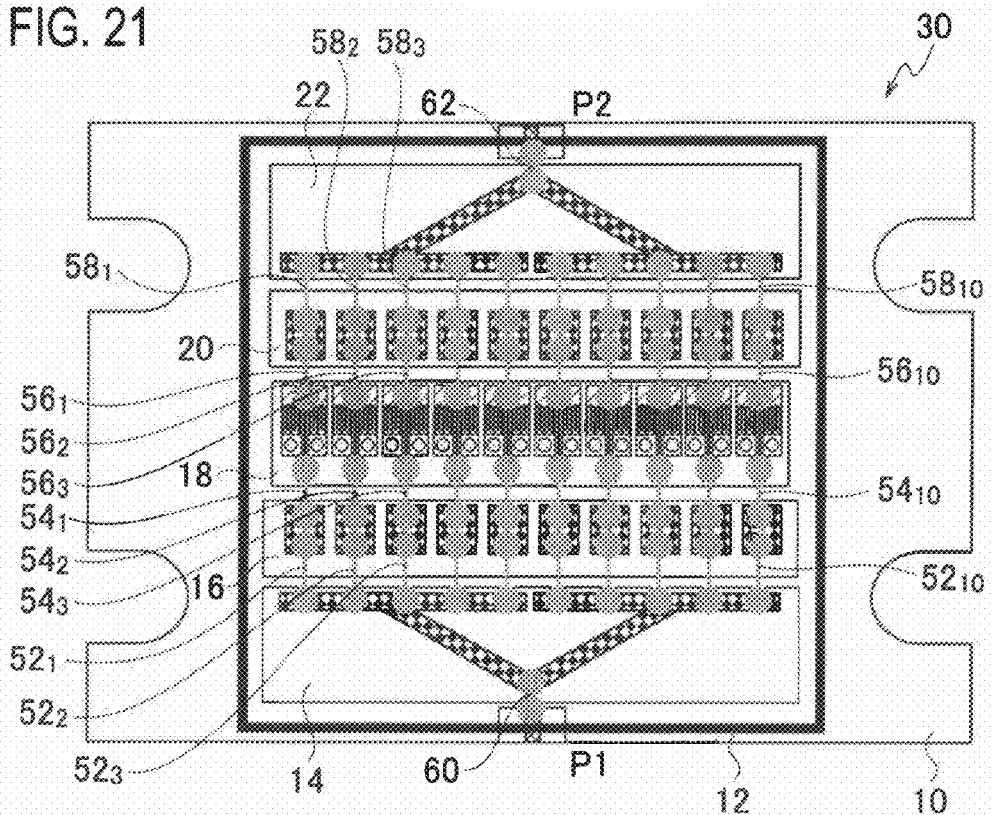
FIG. 21 is a schematic plane pattern configuration diagram at a time of a 100% connection in the high frequency semiconductor device according to the third embodiment.
Figure 22:
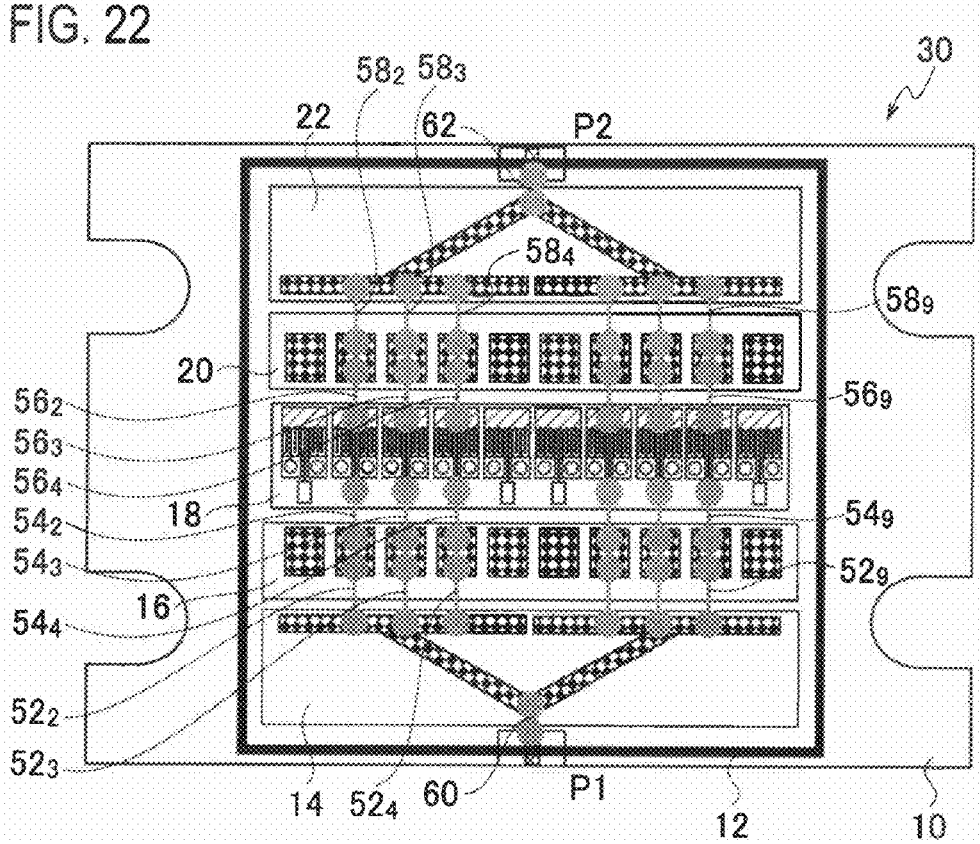
FIG. 22 is a schematic plane pattern configuration diagram at a time of a 60% connection in the high frequency semiconductor device according to the third embodiment.

In the high frequency semiconductor device 30 according to the third embodiment, a schematic plane pattern configuration at a time of a 100% connection is illustrated as shown in FIG. 21, and a schematic plane pattern configuration at a time of a 60% connection is illustrated as shown in FIG. 22.

Moreover, in the high frequency semiconductor device 30 according to the third embodiment, the impedance matching adjusting patterns to be arranged on the distribution/input matching circuit board 14 are omitted, and furthermore, the impedance matching adjusting patterns to be arranged on the synthesis/output matching circuits 34 are omitted, whereby the plane pattern configuration is simplified. Other configurations are similar to those of the first embodiment, and accordingly, a duplicate description is omitted.

In accordance with the third embodiment, a high frequency semiconductor device can be provided, in which the number of active FET cells is changed by connecting and disconnecting the plurality of FET cells to one another in response to the desired output power value without preparing/controlling the power supply for each of the FET cells, whereby the total gate electrode length can be substantially changed to enable the adjustment of the output power value at low cost, and in addition, the plane pattern configuration is simplified.

Moreover, in accordance with the high frequency semiconductor device according to the third embodiment, the system is simplified, and the mass production effect is obtained, whereby the cost can be suppressed.

Fourth Embodiment

Figure 23:
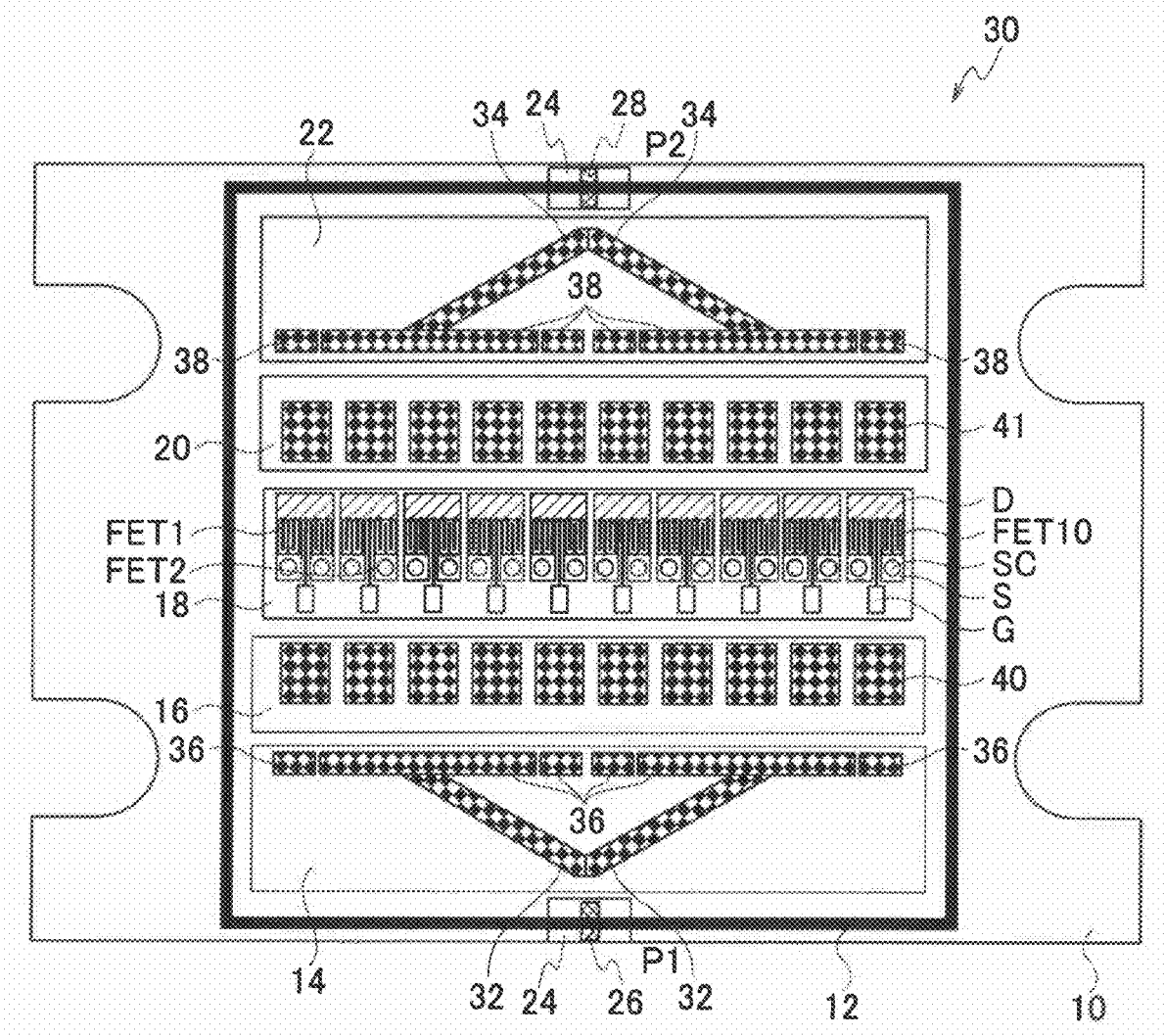
FIG. 23 is a schematic plane pattern configuration diagram of a high frequency semiconductor device according to a fourth embodiment.

A schematic plane pattern configuration of a high frequency semiconductor device 30 according to a fourth embodiment is illustrated as shown in FIG. 23.

Figure 24:
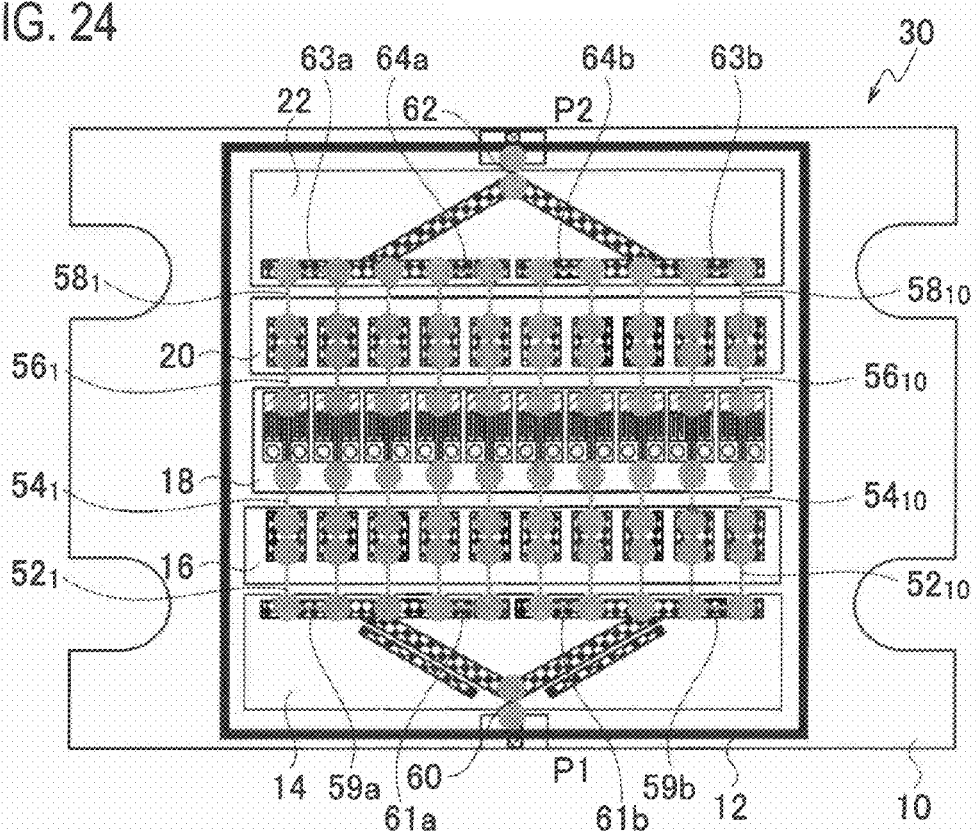
FIG. 24 is a schematic plane pattern configuration diagram at a time of a 100% connection in the high frequency semiconductor device according to the fourth embodiment.
Figure 25:
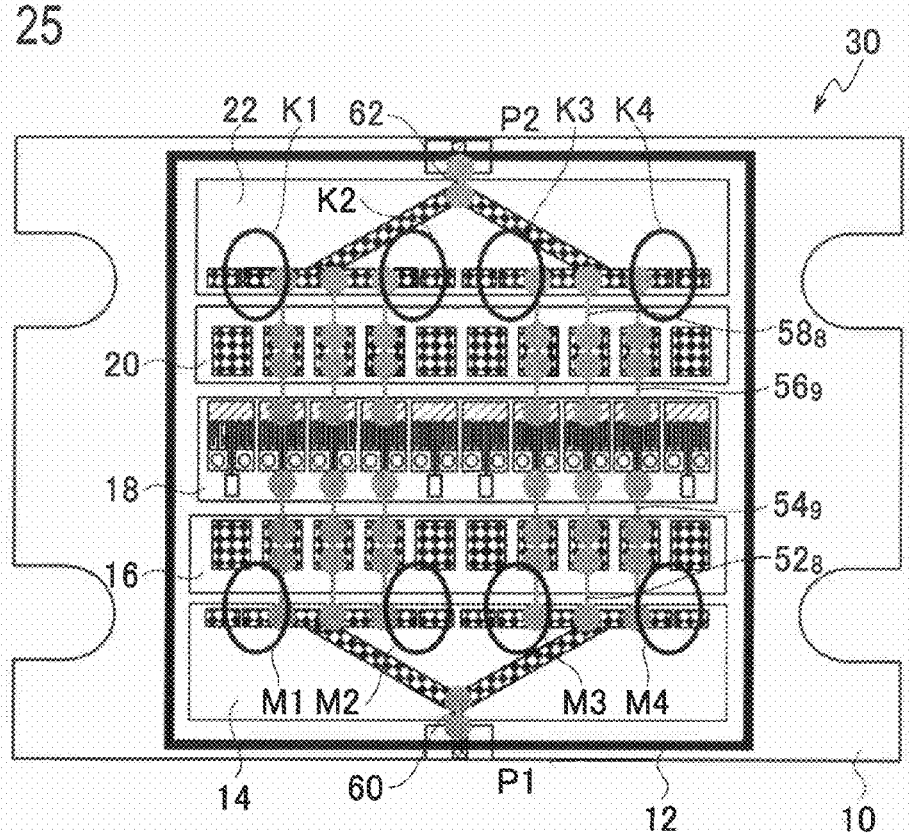
FIG. 25 is a schematic plane pattern configuration diagram at a time of a 60% connection in the high frequency semiconductor device according to the fourth embodiment.

In the high frequency semiconductor device 30 according to the fourth embodiment, a schematic plane pattern configuration at a time of a 100% connection is illustrated as shown in FIG. 24, and a schematic plane pattern configuration at a time of a 60% connection is illustrated as shown in FIG. 25.

In the high frequency semiconductor device 30 according to the fourth embodiment, as shown in FIG. 23 to FIG. 25, the slits M1 to M4 are cut in the input transmission line patterns 36, and the portions divided thereby are made connectable or disconnectable to one another, and the slits K1 to K4 are cut in the output transmission line patterns 38, and the portions divided thereby are made connectable or disconnectable to one another. In the case of allowing the electrical connection of the slits M1 to M4, as shown in FIG. 24, the bonding wires 59a, 61a, 61b and 59b are used, respectively. In a similar way, in the case of allowing the electrical connection of the slits K1 to K4, as shown in FIG. 24, the bonding wires 63a, 64a, 64b and 63b are used, respectively.

Moreover, in the high frequency semiconductor device 30 according to the fourth embodiment, the impedance matching adjusting patterns to be arranged on the distribution/input matching circuit board 14 are omitted, and furthermore, the impedance matching adjusting patterns to be arranged on the synthesis/output matching circuits 34 are omitted, whereby the plane pattern configuration is simplified. Other configurations are similar to those of the first embodiment, and accordingly, a duplicate description is omitted.

In accordance with the fourth embodiment, a high frequency semiconductor device to be described below can be provided. In the high frequency semiconductor device, the slits M1 to M4 are cut in the input transmission line patterns 36, and the portions divided thereby are made connectable or disconnectable to one another, and the slits K1 to K4 are cut in the output transmission line patterns 38, and the portions divided thereby are made connectable or disconnectable to one another. In such a way, the number of active FET cells is changed by connecting and disconnecting the plurality of FET cells to one another in response to the desired output power value without preparing/controlling the power supply for each of the FET cells, whereby the total gate electrode length can be substantially changed to enable the adjustment of the output power value at low cost. In addition, the plane pattern configuration is simplified.

Moreover, in accordance with the high frequency semiconductor device according to the fourth embodiment, the system is simplified, and the mass production effect is obtained, whereby the cost can be suppressed.

In accordance with the embodiments described above, the high frequency semiconductor device can be provided, in which the number of active FET cells is changed by connecting and disconnecting the plurality of FET cells to one another in response to the desired output power value without preparing/controlling the power supply for each of the FET cells, whereby the total gate electrode length can be substantially changed to enable the adjustment of the output power value at low cost. Moreover, the mass production effect is obtained, and the system is simplified, whereby the cost can be suppressed.

Note that the element to be applied to the high frequency semiconductor device is not limited to the FET and the HEMT, and needless to say, as the element concerned, an amplifier element such as a laterally doped metal-oxide-semiconductor field effect transistor (LDMOS) and a hetero-junction bipolar transistor (HBT), a micro electro mechanical systems (MEMS) element and the like can be applied.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A high frequency semiconductor device comprising:
   a distribution/input matching circuit board that mounts thereon a distribution/input matching circuit and an input transmission line pattern;
   an input capacitor board that is arranged adjacent to the distribution/input matching circuit board, and mounts a plurality of input capacitor cells thereon;
   a semiconductor board that is arranged adjacent to the input capacitor board, and mounts a plurality of field effect transistor cells thereon;
   an output capacitor board that is arranged adjacent to the semiconductor board, and mounts a plurality of output capacitor cells thereon; and
   a synthesis/output matching circuit board that is arranged adjacent to the output capacitor board, and mounts thereon an output transmission line pattern and a synthesis/output matching circuit,
   wherein the number of active field effect transistor cells is changed by connecting and disconnecting a plurality of field effect transistor cells to one another in response to a desired output power value, whereby a total gate electrode length is substantially changed, and an output power value is adjusted.

2. The high frequency semiconductor device according to claim 1,
   wherein, on the distribution/input matching circuit board, a first impedance matching adjusting pattern for adjusting impedance matching in response to the change of number of plural field effect transistor cells is provided adjacent to the distribution/input matching circuit, and
   on the synthesis/output matching circuit board, a second impedance matching adjusting pattern for adjusting the impedance matching in response to the change of the number of plural field effect transistor cells is provided adjacent to the synthesis/output matching circuit.

3. The high frequency semiconductor device according to claim 1,
   wherein, by bonding wires, the input transmission line pattern and the plurality of input capacitor cells are connected to each other, the plurality of input capacitor cells and the plurality of field effect transistor cells are connected to each other, the plurality of field effect transistor cells and the plurality of output capacitor cells are connected to each other, and the plurality of output capacitor cells and the output transmission line pattern are connected to each other, and when a desired output power value is small, the bonding wires connected to some of the plurality of field effect transistor cells are detached not to allow an operation of some of the field effect transistor cells, whereby a total gate electrode length is substantially shortened.

4. The high frequency semiconductor device according to claim 2,
   wherein, by bonding wires, the input transmission line pattern and the plurality of input capacitor cells are connected to each other, the plurality of input capacitor cells and the plurality of field effect transistor cells are connected to each other, the plurality of field effect transistor cells and the plurality of output capacitor cells are connected to each other, and the plurality of output capacitor cells and the output transmission line pattern are connected to each other, and when a desired output power value is small, the bonding wires connected to some of the plurality of field effect transistor cells are detached not to allow an operation of some of the field effect transistor cells, whereby a total gate electrode length is substantially shortened.

5. The high frequency semiconductor device according to claim 1,
   wherein a slit is cut in the input transmission line pattern, and portions divided thereby are made connectable or disconnectable to each other, and a slit is cut in the output transmission line pattern, and portions divided thereby are made connectable or disconnectable to each other.

6. The high frequency semiconductor device according to claim 2,
wherein a slit is cut in the input transmission line pattern, and portions divided thereby are made connectable or disconnectable to each other, and a slit is cut in the output transmission line pattern, and portions divided thereby are made connectable or disconnectable to each other.

7. The high frequency semiconductor device according to claim 4,
wherein a slit is cut in the input transmission line pattern, and portions divided thereby are made connectable or disconnectable to each other, and a slit is cut in the output transmission line pattern, and portions divided thereby are made connectable or disconnectable to each other.

8. The high frequency semiconductor device according to claim 1,
wherein the plurality of field effect transistor cells include:
a semi-insulating substrate;
gate finger electrodes, source finger electrodes, and drain finger electrodes, the finger electrodes being arranged on a first surface of the semi-insulating substrate, and each having a plurality of fingers;
a plurality of gate terminal electrodes, and pluralities of source terminal electrodes and drain terminal electrodes, the terminal electrodes being arranged on the first surface of the semi-insulating substrate, and being formed by bundling a plurality of fingers for each of the gate finger electrodes, the source finger electrodes and the drain finger electrodes;
VIA holes arranged in lower portions of the source terminal electrodes; and
a ground electrode that is arranged on a second surface on an opposite side with the first surface of the semi-insulating substrate, and is connected to the source terminal electrodes through the VIA holes.

9. The high frequency semiconductor device according to claim 2,
wherein the plurality of field effect transistor cells include:
a semi-insulating substrate;
gate finger electrodes, source finger electrodes, and drain finger electrodes, the finger electrodes being arranged on a first surface of the semi-insulating substrate, and each having a plurality of fingers;
a plurality of gate terminal electrodes, and pluralities of source terminal electrodes and drain terminal electrodes, the terminal electrodes being arranged on the first surface of the semi-insulating substrate, and being formed by bundling a plurality of fingers for each of the gate finger electrodes, the source finger electrodes and the drain finger electrodes;
VIA holes arranged in lower portions of the source terminal electrodes; and
a ground electrode that is arranged on a second surface on an opposite side with the first surface of the semi-insulating substrate, and is connected to the source terminal electrodes through the VIA holes.

10. The high frequency semiconductor device according to claim 4,
wherein the plurality of field effect transistor cells include:
a semi-insulating substrate;
gate finger electrodes, source finger electrodes, and drain finger electrodes, the finger electrodes being arranged on a first surface of the semi-insulating substrate, and each having a plurality of fingers;
a plurality of gate terminal electrodes, and pluralities of source terminal electrodes and drain terminal electrodes, the terminal electrodes being arranged on the first surface of the semi-insulating substrate, and being formed by bundling a plurality of fingers for each of the gate finger electrodes, the source finger electrodes and the drain finger electrodes;
VIA holes arranged in lower portions of the source terminal electrodes; and
a ground electrode that is arranged on a second surface on an opposite side with the first surface of the semi-insulating substrate, and is connected to the source terminal electrodes through the VIA holes.

11. The high frequency semiconductor device according to claim 5,
wherein the plurality of field effect transistor cells include:
a semi-insulating substrate;
gate finger electrodes, source finger electrodes, and drain finger electrodes, the finger electrodes being arranged on a first surface of the semi-insulating substrate, and each having a plurality of fingers;
a plurality of gate terminal electrodes, and pluralities of source terminal electrodes and drain terminal electrodes, the terminal electrodes being arranged on the first surface of the semi-insulating substrate, and being formed by bundling a plurality of fingers for each of the gate finger electrodes, the source finger electrodes and the drain finger electrodes;
VIA holes arranged in lower portions of the source terminal electrodes; and
a ground electrode that is arranged on a second surface on an opposite side with the first surface of the semi-insulating substrate, and is connected to the source terminal electrodes through the VIA holes.

12. The high frequency semiconductor device according to claim 8, wherein the semi-insulating substrate is any of a GaAs substrate, a SiC substrate, a GaN substrate, a substrate obtained by forming a GaN epitaxial layer on the SiC substrate, a substrate obtained by forming a heterojunction epitaxial layer made of GaN/AlGaN on the SiC substrate, a sapphire substrate and a diamond substrate.

13. The high frequency semiconductor device according to claim 9, where the semi-insulating substrate is any of a GaAs substrate, a SiC substrate, a GaN substrate, a substrate obtained by forming a GaN epitaxial layer on the SiC substrate, a substrate obtained by forming a heterojunction epitaxial layer made of GaN/AlGaN on the SiC substrate, a sapphire substrate and a diamond substrate.

14. The high frequency semiconductor device according to claim 10, where the semi-insulating substrate is any of a GaAs substrate, a SiC substrate, a GaN substrate, a substrate obtained by forming a GaN epitaxial layer on the SiC substrate, a substrate obtained by forming a heterojunction epitaxial layer made of GaN/AlGaN on the SiC substrate, a sapphire substrate and a diamond substrate.

15. The high frequency semiconductor device according to claim 11, where the semi-insulating substrate is any of a GaAs substrate, a SiC substrate, a GaN substrate, a substrate obtained by forming a GaN epitaxial layer on the SiC substrate, a substrate obtained by forming a heterojunction epitaxial layer made of GaN/AlGaN on the SiC substrate, a sapphire substrate and a diamond substrate.

* * * * *